(12) United States Patent
Suh et al.

(10) Patent No.: US 11,271,559 B2
(45) Date of Patent: *Mar. 8, 2022

(54) INTELLIGENT POWER MODULE CONTROL METHOD FOR RESONANT CONVERTER

(71) Applicant: Alpha and Omega Semiconductor (Cayman) Ltd., Grand Cayman (KY)

(72) Inventors: Bum-Seok Suh, Gyeonggi-do (KR); Wonjin Cho, Gyeonggi-Do (KR); Son Tran, San Jose, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 338 days.

This patent is subject to a terminal disclaimer.

(21) Appl. No.: 16/595,063

(22) Filed: Oct. 7, 2019

(65) Prior Publication Data

US 2020/0036375 A1 Jan. 30, 2020

Related U.S. Application Data

(63) Continuation of application No. 15/464,136, filed on Mar. 20, 2017, now Pat. No. 10,476,494.

(51) Int. Cl.
*H03K 17/082* (2006.01)
*H02H 9/04* (2006.01)
(Continued)

(52) U.S. Cl.
CPC .......... *H03K 17/0828* (2013.01); *H02H 6/00* (2013.01); *H02H 9/04* (2013.01); *H03K 17/164* (2013.01);
(Continued)

(58) Field of Classification Search
CPC ............. H03K 17/0828; H03K 17/164; H03K 17/168; H03K 17/18; H02H 9/04; H02H 6/00; H05B 6/04; H05B 6/06
(Continued)

(56) References Cited

U.S. PATENT DOCUMENTS 4,890,185 A 12/1989 Karl et al.
5,500,616 A 3/1996 Ochi
(Continued)

FOREIGN PATENT DOCUMENTS

CN 103794585 5/2014
CN 204906177 12/2015
(Continued)

OTHER PUBLICATIONS

Alkayal et al., "Integrated monolithic over-voltage protection circuit with adjustable threshold voltage," Conference Record of the 2004 IEEE Industry Applications Conference, 2004. 39th IAS Annual Meeting, Oct. 3-7, 2004, pp. 1903-1909.
(Continued)

*Primary Examiner* — Kevin J Comber

(57) ABSTRACT

A method of generating a gate drive signal for driving a control terminal of a power switch includes detecting a system input signal; determining a signal pulse of the system input signal being a first signal pulse following a power up event, or following an idle period, or following removal of a fault condition; and in response, generating a soft gate drive signal to drive the control terminal of the power switch to softly turn on the power switch. In another embodiment, the method includes determining a duration of the on period of the system input signal exceeding a maximum on duration and in response, disabling the gate drive signal to turn off the power switch; and determining a deassertion transition of the system input signal and in response, blocking the system input signal from the gate drive signal for a minimum off duration.

20 Claims, 11 Drawing Sheets

(51) Int. Cl.
*H02H 6/00* (2006.01)
*H03K 17/18* (2006.01)
*H05B 6/06* (2006.01)
*H03K 17/16* (2006.01)
*H02H 3/20* (2006.01)
*H02H 5/04* (2006.01)
*H02H 3/08* (2006.01)
*H02H 3/24* (2006.01)

(52) U.S. Cl.
CPC ........... *H03K 17/168* (2013.01); *H03K 17/18* (2013.01); *H05B 6/062* (2013.01); *H02H 3/08* (2013.01); *H02H 3/20* (2013.01); *H02H 3/207* (2013.01); *H02H 3/24* (2013.01); *H02H 5/04* (2013.01); *H02H 9/041* (2013.01)

(58) Field of Classification Search
USPC ....................................................... 361/91.5
See application file for complete search history.

(56) References Cited

U.S. PATENT DOCUMENTS

| | | | |
|---|---|---|---|
| 5,608,595 | A | 3/1997 | Gourab et al. |
| 6,097,582 | A | 8/2000 | John et al. |
| 6,194,885 | B1 | 2/2001 | Oshima |
| 6,414,533 | B1 | 7/2002 | Graves |
| 7,902,604 | B2 | 3/2011 | Su et al. |
| 9,013,848 | B2 | 4/2015 | Lui |
| 2013/0127429 | A1 | 5/2013 | Li |
| 2014/0346522 | A1 | 11/2014 | Disney et al. |
| 2015/0346750 | A1 | 12/2015 | Bhattad |
| 2016/0099189 | A1 | 4/2016 | Khai Yen et al. |
| 2016/0105017 | A1 | 4/2016 | Mallik et al. |
| 2017/0122996 | A1 | 5/2017 | Sullivan |
| 2017/0302151 | A1 | 10/2017 | Snook et al. |
| 2018/0020507 | A1 | 1/2018 | Liu et al. |
| 2018/0270913 | A1 | 9/2018 | Bredemeier et al. |

FOREIGN PATENT DOCUMENTS

| | | |
|---|---|---|
| CN | 205004739 | 1/2016 |
| CN | 105489561 | 4/2016 |
| CN | 105991005 | 10/2016 |
| TW | 494628 | 7/2002 |
| TW | 201334423 | 8/2013 |
| TW | I426596 | 2/2014 |
| TW | 201440399 | 10/2014 |
| TW | 201534028 | 9/2015 |
| TW | I519068 | 1/2016 |
| TW | 201624901 | 7/2016 |
| TW | 201717354 | 5/2017 |

OTHER PUBLICATIONS

Clark et al., "New SLIM Package Intelligent Power Modules (SLIMDIP) with thin RC-IGBT for consumer goods applications," 2015 IEEE Energy Conversion Congress and Exposition (ECCE), Montreal, QC, Sep. 20-24, 2015, pp. 4510-4512.

Crisafulli et al., "New control method to increase power regulation in a AC/AC quasi resonant converter for high efficiency induction cooker," 2012 3rd IEEE International Symposium on Power Electronics for Distributed Generation Systems (PEDG), Aalborg, DK, Jun. 25-28, 2012, pp. 628-635.

Dulau et al., "A new gate driver integrated circuit for IGBT devices with advanced protections," in IEEE Transactions on Power Electronics, Jan. 2006, vol. 21, No. 1, pp. 38-44.

Honsberg et al., "A novel ultra compact surface mountable 1A/500V rated Intelligent Power Module (IPM) utilizing Silicon On Insulator (SOI) technology," 2007 International Aegean Conference on Electrical Machines and Power Electronics, Sep. 10-12, 2007, Bodrum, TR, pp. 47-51.

Jain et al., "IGBT over voltage protection scheme in quasi resonant induction heating applications," 2015 Annual IEEE India Conference (INDICON), Dec. 17-20, 2015, New Delhi, IN, pp. 1-5.

John et al., "Fast-clamped short-circuit protection of IGBT's," IEEE Transactions on Industry Applications, Mar./Apr. 1999, vol. 35, No. 2, pp. 477-486.

John et al., "High-performance active gate drive for high-power IGBT's," IEEE Transactions on Industry Applications, Sep./Oct. 1999, vol. 35, No. 5, pp. 1108-1117.

Laska et al., "Short circuit properties of Trench-/Field-Stop-IGBTs-design aspects for a superior robustness," Proceedings of the ISPSD '03. 2003 IEEE 15th International Symposium on Power Semiconductor Devices and ICs, Apr. 14-17, 2003, Cambridge, UK, pp. 152-155.

Lucia et al., "Induction Heating Technology and Its Applications: Past Developments, Current Technology, and Future Challenges," IEEE Transactions on Industrial Electronics, May 2014, vol. 61, No. 5, pp. 2509-2520.

Majumdar et al., "Active surge voltage clamped 600 A IPM for high power application," Proceedings of 1995 International Symposium on Power Semiconductor Devices and ICs, May 23-25, 1995, Yokohama, JP, pp. 75-79.

Majumdar et al., "Novel intelligent power modules for low-power inverters," 29th Annual IEEE Power Electronics Specialists Conference (PESC 98) May 17-22, 1998, Fukuoka, JP, pp. 1173-1179.

Rubino et al., "Potential of new SLLIMM™—nano Intelligent Molded Module for low power home appliance motor drives," 15th International Power Electronics and Motion Control Conference (EPE/PEMC), Sep. 4-6, 2012, Novi Sad, RS, pp. LS6d.1-1-LS6d.1-7.

Shim et al., "A new high efficient 2-phase and 3-phase interleaved Power Factor Correction boost converter typed Intelligent Power Module with high switching capability for low power home appliances," 9th International Conference on Power Electronics and ECCE Asia (ICPE-ECCE Asia), Jun. 1-5, 2015, Seoul, KR, pp. 2324-2327.

Song et al., "A new intelligent power module with Reverse conducting IGBTs for up to 2.5kW motor drives," 2010 International Power Electronics Conference (IPEC), Jun. 21-24, 2010, Sapporo, JP, pp. 156-158.

Song et al., "The new intelligent power modules with Reverse conducting IGBTs and SOI driver for low power motor drives," 2010 International Conference on Electrical Machines and Systems (ICEMS), Oct. 10-13, 2010, Incheon, KR, pp. 384-386.

Tulu et al., "Induction cooker design with quasi resonant topology using jitter drive method," 2013 12th International conference on Environment and Electrical Engineering (EEEIC), May 5-8, 2013, Wroclaw, PL, pp. 1-6.

Wang et al., "A di/dt Feedback-Based Active Gate Driver for Smart Switching and Fast Overcurrent Protection of IGBT Modules," IEEE Transactions on Power Electronics, Jul. 2014, vol. 29, No. 7, pp. 3720-3732.

Yoshida et al., "A self-isolated intelligent IGBT for driving ignition coils," Proceedings of the 10th International Symposium on Power Semiconductor Devices and ICs (ISPD '98), Jun. 3-6, 1998, Kyoto, JP, pp. 105-108.

INTELLIGENT POWER MODULE CONTROL METHOD FOR RESONANT CONVERTER

CROSS REFERENCE TO OTHER APPLICATIONS

This application is a continuation of U.S. patent application Ser. No. 15/464,136, entitled INTELLIGENT POWER MODULES FOR RESONANT CONVERTER, filed Mar. 20, 2017, which is incorporated herein by reference for all purposes.

BACKGROUND OF THE INVENTION

Induction heating has been widely adopted in domestic, industrial and medical applications. Induction heating refers to the technique of heating an electrically conducting object (such as a metal) by electromagnetic induction whereby electric current is generated in a closed circuit (the object) by the fluctuation of current in another circuit placed physically close to the object. For example, an induction cooker includes a resonant tank driven by an alternating current to induce an alternating magnetic field at an induction coil. The alternating magnetic field at the induction coil induces current in a metal cooking pot placed physically near the induction coil. The current induced in the resistive metal cooking pot generates heat which in turn heats the food in the cooking pot.

A commonly used topology for induction heating applications is the single switch quasi-resonant inverter topology including a single power switch and a single resonant capacitor to supply variable resonant current to the induction coil. The single switch quasi-resonant inverter is often implemented using an insulated gate bipolar transistor (IGBT) as the power switching device due to the high power capability and high switching frequency operation of IGBTs.

Overvoltage conditions, such as a power surge, can be a serious problem for the single switch quasi-resonant inverter circuit. In particular, the power switching device in the quasi-resonant inverter circuit may fail or become permanently damaged when a voltage exceeding the voltage rating of the power switching device is applied. For example, an abnormally high surge voltage may be applied to the AC input line during a lightning event. In the event that the surge voltage exceeds the breakdown voltage of the power switching device, the power switching device may become irreversibly damaged if remedial action is not taken within a very short time from the power surge event, on the order of a few microseconds. Besides overvoltage conditions, the signal switch quasi-resonant inverter circuit may also suffer from other fault conditions impacting the reliability and efficiency of the quasi-resonant inverter circuit.

BRIEF DESCRIPTION OF THE DRAWINGS

Various embodiments of the invention are disclosed in the following detailed description and the accompanying drawings.

DETAILED DESCRIPTION

Figure 1:
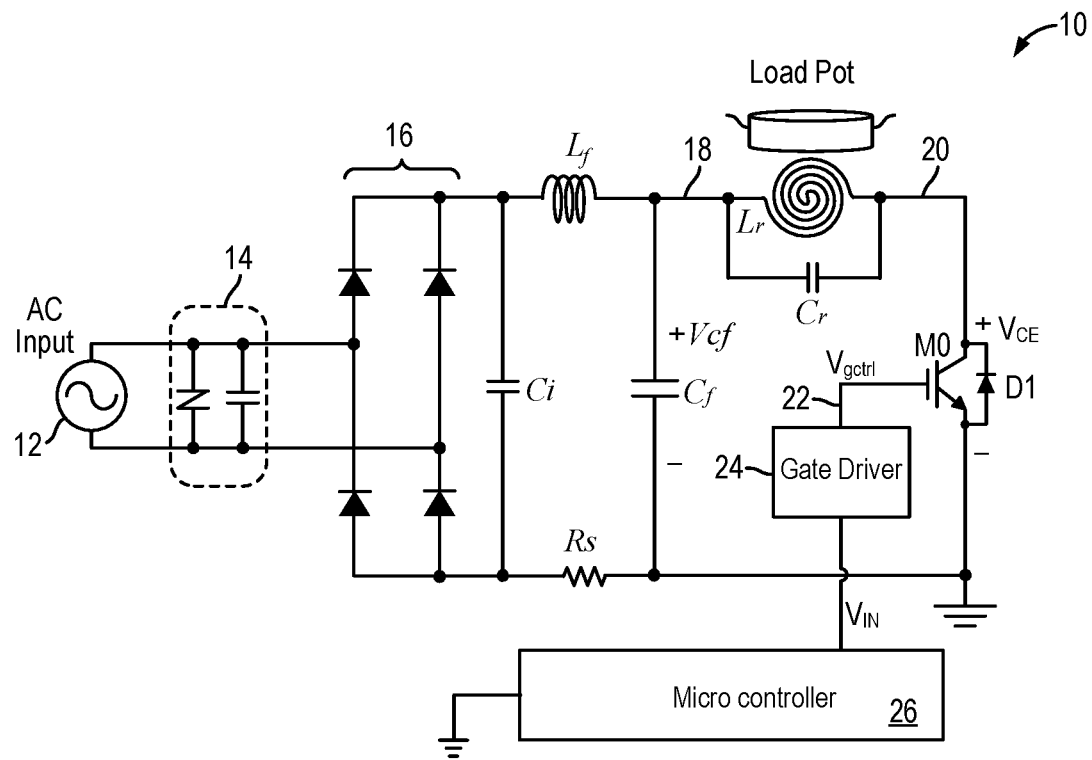
FIG. 1 is a circuit diagram of a single switch quasi-resonant inverter applied in an induction heating application in a conventional configuration.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, an intelligent power module includes a power switching device, a freewheeling device, and a controller circuit incorporating a gate drive circuit and one or more power switch protection circuits. In one embodiment, the power switching device or power switch is an insulated gate bipolar transistor (IGBT) device and the freewheeling device is a PN junction diode. In one embodiment, the controller circuit is implemented as a semiconductor integrated circuit (IC). The intelligent power module implements protection functions for the power switching device where the protection circuits are formed on the controller circuit IC and co-packaged with the power switch. In this manner, a power switch can be applied in applications without the need for the user to provide separately the often necessary and desirable protection functions.

In some embodiments, the intelligent power module is applied in a single switch quasi-resonant inverter for induction heating applications. The single switch quasi-resonant inverter is often implemented using an insulated gate bipolar transistor (IGBT) as the power switching device due to the high power capability and high switching frequency operation of the IGBTs. However, the IGBT often requires protection from fault conditions and events especially when the IGBT is operated in the high power, high current regime. The intelligent power module of the present invention provides a single semiconductor package incorporating the power switching device with incorporated protection circuits to ease the construction of the quasi-resonant inverter circuit, especially when applied in induction heating applications.

In embodiments of the present invention, the control circuit in the intelligent power module includes an active soft-start circuit to detect for conditions where soft-start of the power switch is desired and activates a soft-start gate drive circuit to realize soft-start of the power switch. In this manner, the reliability of the power switch is enhanced by avoiding hard turn-on of the power switch.

In embodiments of the present invention, the control circuit in the intelligent power module includes an active turn-on pulse control circuit to detect for abnormal system input signal pulse events and activates the active turn-on pulse control circuit to block system input pulses where necessary. In some embodiments, the active turn-on pulse control circuit includes a maximum duty cycle detection circuit and an abnormal turn-on detection circuit. In this manner, the power switch is protected from abnormal events that may cause damage or may impact the reliability of the power switch.

The present application is related to co-pending and commonly assigned U.S. patent application Ser. No. 15/360, 590, entitled Active Clamp Overvoltage Protection For Switching Power Device, filed Nov. 23, 2016, which application is incorporated herein by reference in its entirety for all purposes. The present application is also related to co-pending and commonly assigned U.S. patent application Ser. No. 15/464,130, entitled Two Level Protection Control Method For Switching Power Device, filed concurrently on Mar. 20, 2017, which application is incorporated herein by reference in its entirety for all purposes.

FIG. 1 is a circuit diagram of a single switch quasi-resonant inverter applied in an induction heating application in a conventional configuration. Referring to FIG. 1, a single switch quasi-resonant inverter 10 includes a surge suppressor 14, a bridge rectifier 16, a filter circuit, a resonant tank and a power switching device M0, also referred to as a power switch. The quasi-resonant inverter 10 receives an AC input voltage 12 which is coupled to the surge suppressor 14. The bridge rectifier 16, also referred to as a diode bridge, converts the AC input voltage 12 to a DC voltage which is then filtered by the filter circuit including an input capacitor $C_i$, a filter inductor $L_f$, a filter capacitor $C_f$ and a resistor $R_S$.

The filtered DC voltage Vcf (node 18) is applied to the resonant tank formed by an induction coil Lr and a resonant capacitor Cr. The induction coil Lr is connected to the power switch M0 which is switched on and off in response to a gate drive signal $V_{gctrl}$. A freewheeling diode D1 is connected across the power switch M0. When the power switch M0 is turned on, a current $i_C$ flow from the induction coil Lr through the power switch M0 to ground. When the power switch M0 is turned off, no current flow through the power switch M0. Instead, a current $i_{Lr}$ circulates between the induction coil Lr and the resonant capacitor Cr. In the present embodiment, the power switch M0 is an insulated gate bipolar transistor (IGBT). The collector terminal of the IGBT is connected to the induction coil Lr (node 20) and the emitter terminal of the IGBT is connected to ground. The gate terminal of the IGBT is driven by the gate drive signal $V_{gctrl}$ (node 22). The power switch M0 is turned on and off in response to the gate drive signal $V_{gctrl}$ to control the amount of electric current induced in the cooking pot, thereby controlling the amount of heat generated.

In the quasi-resonant inverter 10, the power switch M0 is driven by the gate drive signal $V_{gctrl}$ to turn on and off in response to a system input signal $V_{IN}$ provided by a host system, such as a micro-controller 26. The system input signal drives a gate driver circuit 24 which generates the gate drive signal $V_{gctrl}$ for driving the power switch M0. In the conventional configuration, the quasi-resonant inverter 10 is constructed using discrete components—the power switch, the freewheeling diode and the gate driver circuit are implemented as separate, discrete components. Furthermore, the conventional quasi-resonant inverter 10 does not include any protection functions for the power switch. During operation, the power switch M0 may be subjected to various unsafe operating conditions from which protection is desired to ensure the reliability of the power switch.

Intelligent Power Module

Figure 2:
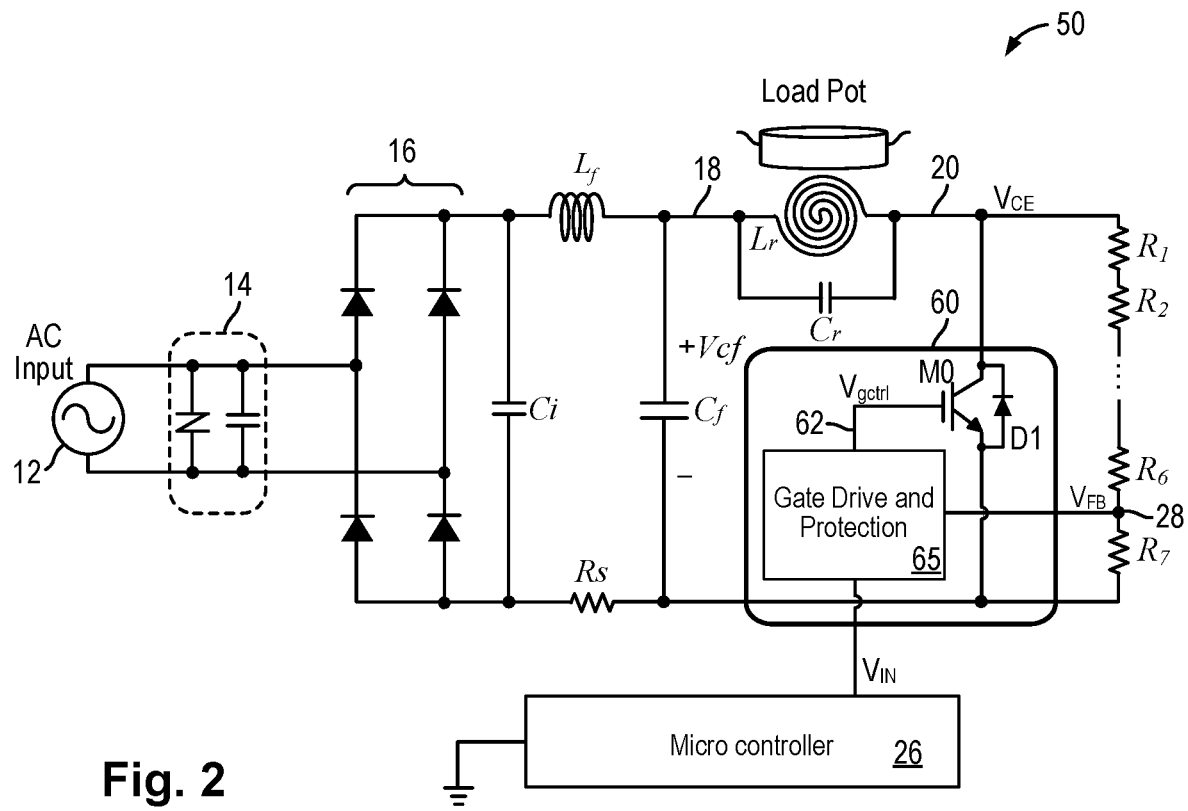
FIG. 2 is a circuit diagram of a single switch quasi-resonant inverter implemented using an intelligent power module and applied in an induction heating application in some embodiments of the present invention.

FIG. 2 is a circuit diagram of a single switch quasi-resonant inverter implemented using an intelligent power module and applied in an induction heating application in some embodiments of the present invention. Referring to FIG. 2, a single switch quasi-resonant inverter 50 includes a surge suppressor 14, a bridge rectifier 16, a filter circuit, a resonant tank and an intelligent power module 60. The intelligent power module 60 incorporates a power switching device M0, also referred to as a power switch, a freewheeling diode D1 and a controller circuit 65. The controller circuit 65 implements the gate drive function to generate the gate drive signal $V_{gctrl}$ (node 62) to drive the power switch M0. The controller circuit 65 further includes one or more protection circuits implementing one or more protection functions to protect the power switch M0 from undesirable operating conditions, such as over-voltage or under-voltage conditions, power surge events and abnormal system input pulses.

The quasi-resonant inverter 50 receives an AC input voltage 12 which is coupled to the surge suppressor 14. The bridge rectifier 16, also referred to as a diode bridge, converts the AC input voltage 12 to a DC voltage which is then filtered by the filter circuit including an input capacitor $C_i$, a filter inductor $L_f$, a filter capacitor $C_f$ and a resistor $R_S$. The filtered DC voltage $V_{Cf}$ (node 18) is applied to the resonant tank formed by an induction coil Lr and a resonant capacitor Cr. The induction coil Lr is connected to the power switch M0 in the intelligent power module 60 where the power switch M0 is switched on and off in response to the gate drive signal $V_{gctrl}$. The freewheeling diode D1 is connected in parallel to the power switch M0 with the cathode connected to the induction coil Lr (node 20). When the power switch M0 is turned on, a current $i_C$ flow from the induction coil Lr through the power switch M0 to ground. When the power switch M0 is turned off, no current flow through the power switch M0. Instead, a current $i_{Lr}$ circulates between the induction coil Lr and the resonant capacitor Cr. In the present embodiment, the power switch M0 is an insulated gate bipolar transistor (IGBT). The collector terminal of the IGBT is connected to the induction coil Lr (node 20) and the emitter terminal of the IGBT is connected to ground. The gate terminal of the IGBT is driven by the gate drive signal $V_{gctrl}$. The anode of the freewheeling diode D1 is connected to the emitter terminal of the IGBT and the cathode of the freewheeling diode D1 is connected to the collector terminal of the IGBT. In the present embodiment, the power switch M0 is an insulated gate bipolar transistor (IGBT).

In operation, when the power switch M0 (IGBT) is turned on, an alternating electric current flows through the induction coil Lr, which produces an oscillating magnetic field. The oscillating magnetic field induces an electric current into a metal cooking pot placed physically near the induction coil. The current flows in the resistive metal pot will generate heat, thereby heating the food in the cooking pot. When the power switch M0 is turned off, the current ii, circulates around the induction coil Lr and the capacitor Cr. The power switch M0 is turned on and off in response to the gate drive signal $V_{gctrl}$ to control the amount of electric current induced in the cooking pot, there by controlling the amount of heat generated.

More specifically, in the quasi-resonant inverter 50, the power switch M0 is driven by the gate drive signal $V_{gctrl}$ to turn on and off in response to a system input signal $V_{IN}$ provided by a host system, such as a micro-controller 26. More specifically, the system input signal determining an on-period and off-period of the power switch. In embodiments of the present invention, the system input signal $V_{IN}$ is provided to the intelligent power module 60, and in particular, to the controller circuit 65. The controller circuit 65 generates the gate drive signal $V_{gctrl}$ (node 62) for driving the power switch M0. To implement protection functions for the power switch, the intelligent power module receives a feedback voltage $V_{FB}$ (node 28) indicative of the collector-to-emitter voltage $V_{CE}$ of the IGBT, or the voltage across the power terminals of the power switch M0. In the present embodiment, a voltage divider formed by a resistor chain of resistors R1 to R7 is coupled to the collector terminal (node 20) of the IGBT to divide down the collector-to-emitter voltage $V_{CE}$ as the feedback voltage $V_{FB}$. The feedback voltage $V_{FB}$ (node 28) is ten coupled to the intelligent power module 60 to implement protection functions. In the present example, the voltage divider is formed by the resistor chain of multiple resistors to generate the feedback voltage $V_{FB}$. In other embodiments, the voltage divider may be formed by only two resistors to divide down the collector-to-emitter voltage $V_{CE}$ to generate the feedback voltage $V_{FB}$.

In some embodiments, the intelligent power module 60 is applied in a single switch quasi-resonant inverter for induction heating applications. The single switch quasi-resonant inverter is often implemented using an insulated gate bipolar transistor (IGBT) as the power switching device due to the high power capability and high switching frequency operation of the IGBTs. However, the IGBT often requires protection from fault conditions and events especially when the IGBT is operated in the high power, high current regime. The intelligent power module 60 provides a single semiconductor package incorporating the power switching device with incorporated protection circuits to ease the construction of the quasi-resonant inverter circuit, especially when applied in induction heating applications.

Figure 3:
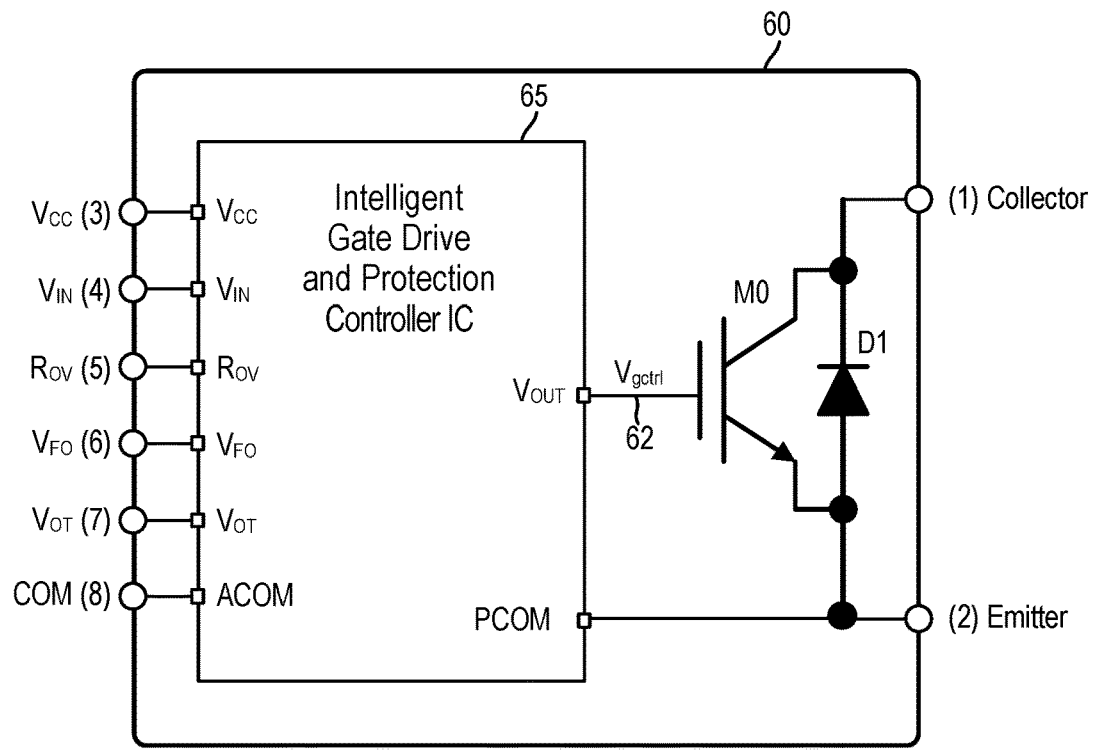
FIG. 3 is an intelligent power module in a monolithic semiconductor package in some embodiments of the present invention.

In embodiments of the present invention, the intelligent power module is constructed using discrete components copackaged into a single semiconductor integrated circuit package. More specifically, the intelligent power module includes the power switch being a discrete IGBT device, the freewheeling device being a discrete PN junction diode, and the controller circuit being implemented as a semiconductor integrated circuit (IC). In one embodiment, the IGBT device, the PN junction diode and the controller circuit IC are co-packaged in a monolithic semiconductor package. FIG. 3 is an intelligent power module in a monolithic semiconductor package in some embodiments of the present invention. Referring to FIG. 3, the intelligent power module 60 includes the controller circuit integrated circuit (IC) 65 copackaged with the discrete power switch (IGBT) M0 and the freewheeling device (PN junction diode) D1. The controller circuit integrated circuit (IC) 65 includes the gate drive circuit for generating the gate drive signal $V_{gctrl}$ to drive the gate terminal of the power switch M0. The controller circuit integrated circuit (IC) 65 also includes protection circuits implementing protection functions for the power switch M0.

As thus configured, the intelligent power module 60 includes input/output terminals to enable the power module to be connected to external circuitry in the desired application. In the present embodiment, the intelligent power module 60 includes a first terminal being the collector terminal of the IGBT power switch and a second terminal being the emitter terminal of the IGBT power switch. The gate terminal 62 of the IGBT M0 is internal to the intelligent power module 60 and is coupled to the output voltage $V_{OUT}$ of the controller circuit IC 65. The controller circuit IC 65 generates the output voltage $V_{OUT}$ as the gate drive signal $V_{gctrl}$ for driving the IGBT. The emitter terminal of the IGBT is coupled to the common mode PCOM terminal of the controller circuit IC. In actual implementation, the emitter terminal is typically connected to ground so that the PCOM terminal of the controller circuit IC is also connected to ground.

The intelligent power module 60 further includes a third terminal being the positive power supply terminal receiving a positive power supply voltage Vcc or Vdd, a fourth terminal receiving the system input signal $V_{IN}$ from an external host system, and a fifth terminal receiving a feedback signal $R_{OV}$. In one example, the feedback signal $R_{OV}$ is the feedback voltage $V_{FB}$ (FIG. 2) indicative of the collector-to-emitter voltage $V_{CE}$ of the IGBT. The intelligent power module 60 includes a sixth terminal providing a fault output signal $V_{FO}$ as an output signal indicator of a detected fault condition at the IGBT and a seventh terminal providing an over-temperature indicator signal $V_{OT}$ as an output signal indicator of a detected over-temperature condition at the IGBT. The fault output signal $V_{FO}$ and the over-temperature indicator signal $V_{OT}$ are optional and may be omitted in other embodiments of the present invention. Lastly, the intelligent power module 60 includes an eighth terminal COM receiving a ground voltage.

Figure 4:
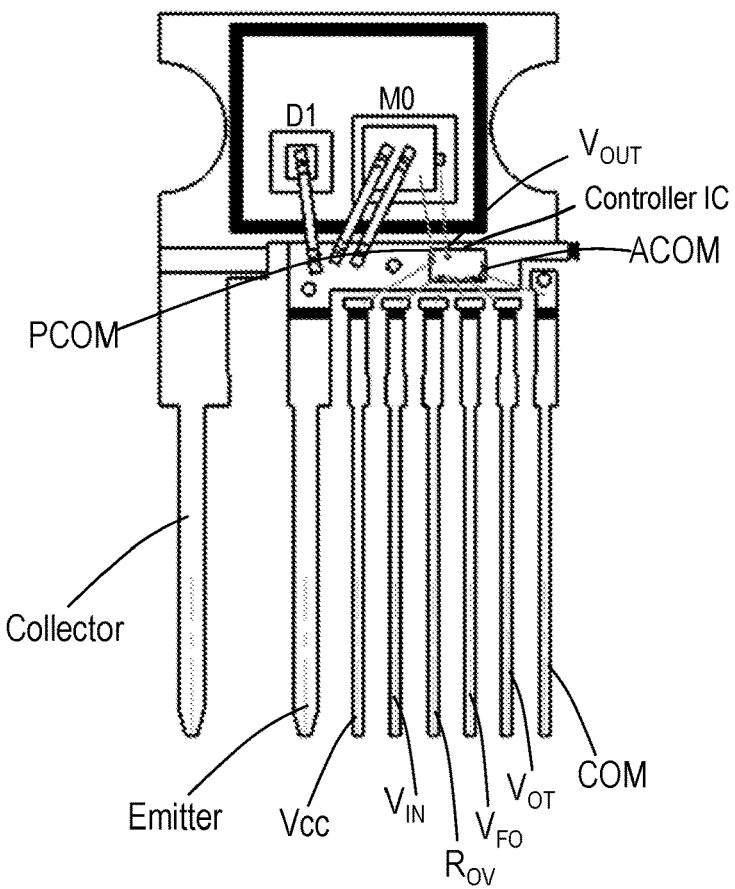
FIG. 4 illustrates an intelligent power module constructed using a monolithic semiconductor package in some embodiments of the present invention.

FIG. 4 illustrates an intelligent power module constructed as a monolithic semiconductor package in some embodiments of the present invention. Referring to FIG. 4, the intelligent power module is packaged in a plastic transistor package. In the present example, the intelligent power module is packaged using a Transistor Outline (TO) package. The power switch M0 having a large die size to handle the high voltage and high current operating condition. The diode D1 is formed copackaged with the power switch M0. The controller circuit IC is a fraction of the size of the power switch M0 and can be mounted on the leadframe of the TO package.

Figure 5:
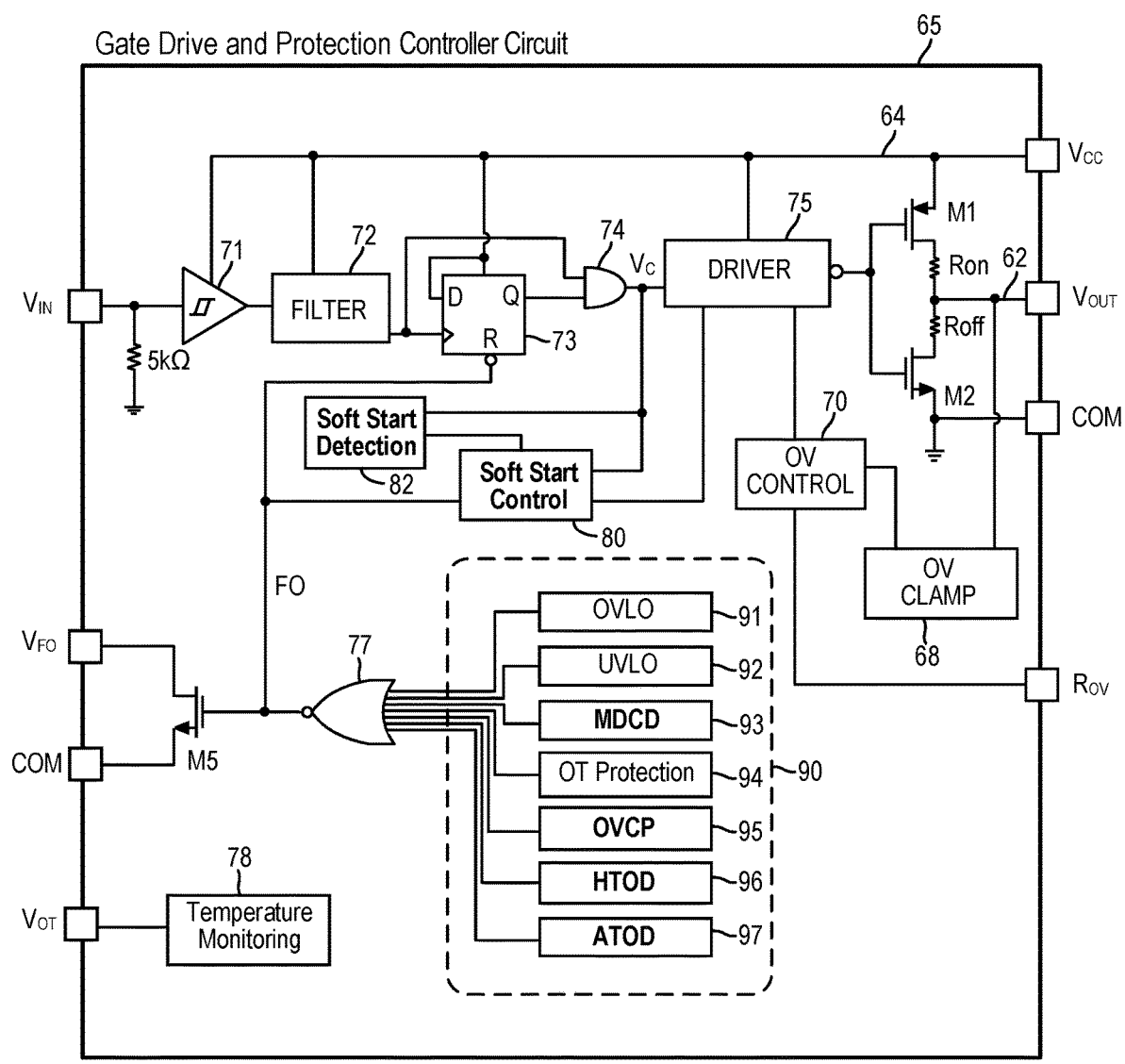
FIG. 5 is a schematic diagram of a controller circuit which can be incorporated in the intelligent power module in some embodiments of the present invention.

FIG. 5 is a schematic diagram of a controller circuit which can be incorporated in the intelligent power module in some embodiments of the present invention. Referring to FIG. 5, the controller circuit 65 receives the system input signal $V_{IN}$ which is latched by a Schmitt trigger 71 and processed a filter 72 and then coupled to the clock input of a D-flip-flop 73. The system input signal $V_{IN}$ is further coupled to a logical AND gate 74 which also receives the output signal of the D-flip-flop 73 as the other input. The output of the AND gate is the control signal driving the driver circuit 75. The controller circuit 75 includes PMOS transistor M1, NMOS transistor M2 with accompanying resistors Ron and Roff to form the normal gate drive circuit. The common node 62 between the resistors Ron and Roff is the output voltage $V_{OUT}$ to be coupled to the power switch as the gate drive signal $V_{gctrl}$. The transistors M1 and M2 are driven by the driver circuit 75. As thus configured, the controller circuit 65 receives the system input signal $V_{IN}$ which has a given duty cycle and determines the on-duration and off-duration of the power switch. The input signal $V_{IN}$ is processed to generate the control signal $V_C$ which is coupled to drive the gate drive circuit for generating the output voltage $V_{OUT}$ for actually driving the power switch. The control signal $V_C$ mirrors the system input signal $V_{IN}$ except when the protection functions are activated to modify or block the system input signal pulses.

In particular, the controller circuit IC 65 includes a set of protection circuits 90 to implement protection functions for protecting the power switch from damage or from degradation. Each of the protection circuits 91-97 generates an output signal that is coupled to the NOR gate 77. In one embodiment, the protection circuits 91-97 generate output signals that are active high when the associated fault is detected. The output of the NOR gate 77 is a Fault indicator signal FO which may be used to generate the fault output signal $V_{FO}$ through NMOS transistor M5. In one embodiment, the Fault indicator signal FO is an active low signal. The fault output signal $V_{FO}$ can be used to inform the micro controller or an external host system of the condition of the power module. The Fault indicator signal FO is also coupled to the soft-start control circuit 80 and the reset terminal of the D-flip-flop 73. When one of the protection circuits 91-97 detects a fault condition and asserts its output signal, the reset terminal of the D-flip-flop 73, which is active low, will be asserted to cause the AND gate 74 to be disabled. Therefore, the control voltage $V_C$ will be disabled and will not pass the system input signal pulses, if any, to the gate drive circuit.

In some embodiments, the controller circuit 65 implements one or more of the following protection functions:

(1) OVCP: The controller circuit 65 may implement an over-voltage clamp protection scheme to protect the IGBT from over-voltage conditions or power surge events. Excessive voltage across the collector and emitter terminal of the IGBT, especially during the off-duration of the IGBT, can cause irrevocable damage to the IGBT. In some embodiments, the OVCP protection scheme turns on the IGBT while applying voltage clamping to the gate terminal of the IGBT when the collector-emitter voltage of the IGBT exceeds the device's breakdown voltage. In this manner, over-voltage conditions or power surges are dissipated safely from the IGBT before any irreparable damages are made.

In embodiments of the present invention, the OVCP protection scheme is implemented by an over-voltage (OV) control circuit 70 driving an over-voltage (OV) clamp circuit 68. In one example, the OVCP protection scheme is implemented using the over-voltage protection scheme described in the aforementioned copending and commonly assigned U.S. patent application Ser. No. 15/360,590. Furthermore, in the present embodiment, the protection circuit 90 includes an OVCP protection circuit 95 which is activated when an over voltage condition is detected to block the system input signal and to disable the control signal $V_C$. The OV clamp circuit 68 is activated by the OV control circuit 70 to turn on the IGBT at a clamped gate voltage to dissipate the over-voltage.

(2) Soft-Start: The controller circuit 65 may implement a soft-start protection scheme to cause the IGBT to softly turn under certain operating conditions. In the present embodiment, softly turning on the IGBT refers to apply a slowly rising gate voltage to the IGBT. Soft-start or soft turn-on function limits the inrush current to the circuit coupled to the IGBT to reduce noise and other issues that may occur when a large inrush current is supplied. For example, in the induction heating application, it is desirable to limit the inrush current while the resonant capacitor Cr is charging up.

In embodiments of the present invention, the soft-start protection function is implemented by a soft-start detection circuit 82 and a soft-start control circuit 80. Soft start protection is activated for an initial input pulse following power up of the power module, for a first input pulse after a long idle period, and for a first input pulse after a fault condition has been removed. The soft-start protection function will be described in more detail below.

(3) ATOD: The controller circuit 65 may implement an abnormal input signal disabling scheme during off-period of the IGBT. In particular, when the IGBT is turned off, noise or ringing on the system input signal may cause the IGBT to be turned back on unintentionally as soon as the IGBT is turned off. Such a quick sequence of turning off and on is undesirable for the IGBT. In embodiments, the abnormal input signal disabling scheme implements a minimum off-duration for the power switch where the power switch is not allowed to turn back on until the minimum off-duration. In this manner, abnormal or unwanted input signal pulses are ignored to prevent the IGBT from being turned back on unintentionally. In embodiments of the present invention, the abnormal input signal disabling scheme is implemented by an ATOD circuit 97.

(4) MDCD: The controller circuit 65 may implement a maximum duty cycle disable scheme to protect the IGBT from an excessively long input signal which may damage the IGBT or the application circuit. The maximum duty cycle disable scheme limits the maximum on-duration for the IGBT. In embodiments of the present invention, the maximum duty cycle disable scheme is implemented by a MDCD circuit 93. When the on-duration of the IGBT exceeds the maximum duty cycle, the MDCD circuit 93 will block the system input signal and will cause the IGBT to be turned on.

(5) HTOD: The controller circuit 65 may implement a hard turn-on disable function to prevent the power switch from turning on when the power switch is sustaining a high voltage value. In embodiments of the present invention, the hard turn-on disable function is implemented by a HTOD circuit 96. The HTOD circuit 96 detects the voltage across the IGBT and is activated to block the system input signal when the voltage across the IGBT is above a given threshold. In one example, the HTOD protection scheme is implemented using the HTOD protection scheme described in the aforementioned copending and commonly assigned U.S. patent application Ser. No. 15/464,130.

(6) OT: The controller circuit 65 may implement an over temperature protection function to protect the IGBT or the power module form overheating. The over temperature protection function monitors the temperature using a temperature monitoring circuit 78 and generates an over-temperature output signal $V_{OT}$. In this manner, a host system may monitor the output signal $V_{OT}$ to determine if the power module is experiencing an over-heating condition. Furthermore, in the present embodiment, the protection circuit includes an over temperature (OT) protection circuit 94 which is activated in an over-temperature condition to disable the power switch.

(7) UVLO/OVLO: The controller circuit 65 may implement an under voltage and over voltage protection for the controller circuit by turning off the output voltage when the power supply voltage is detected to be out of range. In embodiments of the present invention, the under voltage protection scheme is implemented by UVLO circuit 92 while the over voltage protection scheme is implemented by OVLO circuit 91. The UVLO (under voltage lock out) circuit 92 detects that the power supply voltage Vcc is lower than a given threshold and disables the gate driver circuit and turns off the IGBT. The OVLO (over voltage lock out) circuit 91 detects that the power supply voltage Vcc exceeds a given threshold and disables the gate driver circuit and turns off the IGBT.

Soft Start Control

In practical induction heating applications, the quasi-resonant inverter system start its operation by performing load detection control. That is, single or multiple system input signal pulses are provided to turn on the IGBT at the start-up or power up, and the corresponding current or voltage responses are fed back to the micro controller to determine the load to be driven. During the load detection, the quasi-resonant inverter inevitably suffers from high inrush current. Once the resonant capacitor Cr is charged, the quasi-resonant inverter can then operate in zero-voltage switching (ZVS) turn-on. Thus, the inrush current at the first turn-on pulse is at the most severe level in overall operation.

In embodiments of the present invention, the controller circuit of the intelligent power module implements a soft start protection scheme which is activated under certain operating conditions to turn on the power switch (IGBT) softly so as to limit the inrush current. In the present embodiment, softly turning on the IGBT refers to applying a slowly rising gate voltage to the IGBT. In some embodiments, the soft start protection scheme uses a soft-start gate drive circuit, separately from the normal gate drive circuit, during soft-start operation to turn on the power switch softly. By soft-starting the power switch, the inrush current is minimized to reduce problems associated with excessive peak current and ground noise during start-up of the power switch. Limiting inrush current also improves the long term reliability of the power switch.

Figure 6:
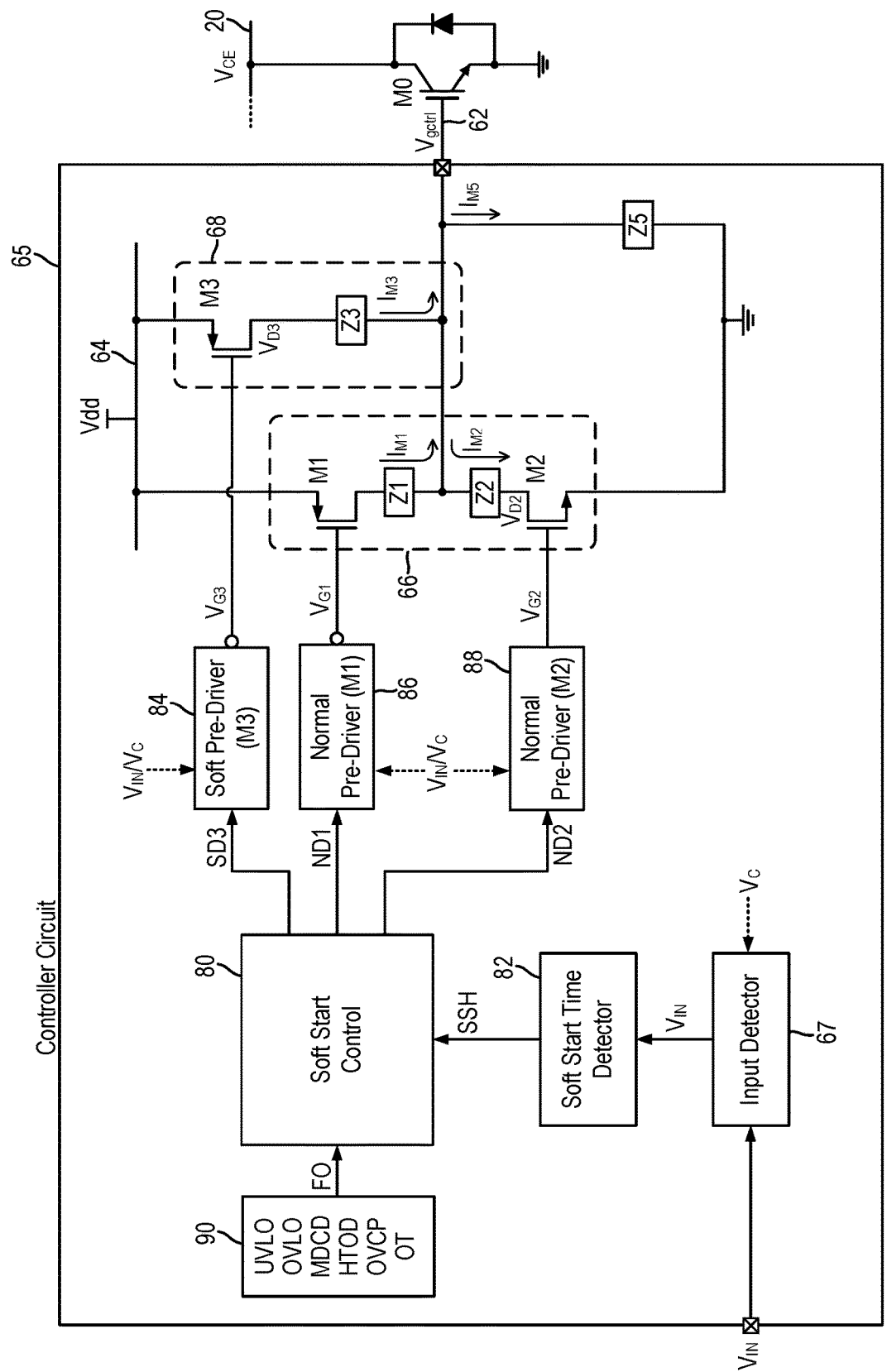
FIG. 6 is a schematic diagram illustrating the construction of the soft start protection circuit in the controller circuit of FIG. 5 in embodiments of the present invention.

FIG. 6 is a schematic diagram illustrating the construction of the soft start protection circuit in the controller circuit of FIG. 5 in embodiments of the present invention. Referring to FIG. 6, the controller circuit 65 includes a normal gate drive circuit 66 and a soft-start protection gate drive circuit 68. In some embodiments, the soft-start protection gate drive circuit 68 can be a shared circuit which is also used as the over-voltage protection gate drive circuit, as will be explained in more detail below.

In controller circuit 65, the normal gate drive circuit 66 is driven in response to the system input signal $V_{IN}$ to control the on and off switch cycle of the power switch M0 or the IGBT to obtain the desired power output at the quasi-resonant inverter. The system input signal $V_{IN}$ can be a PWM signal, or a clock signal switching between on period and off period. The normal gate drive circuit 66 generates an output signal on node 62 as the gate drive signal $V_{gctrl}$ coupled to the gate terminal of the IGBT. In the present embodiment, the normal gate drive circuit 66 is constructed as a CMOS inverter and includes a PMOS transistor M1 connected in series with an NMOS transistor M2 between the positive power supply Vdd (node 64) and ground. An impedance Z1 is coupled to the drain terminal of the PMOS transistor M1 and an impedance Z2 is coupled to the drain terminal of the NMOS transistor M2. The common node 62 between the PMOS transistor M1 and the NMOS transistor M2 is the output signal of the normal gate drive circuit 66.

Gate control signals $V_{G1}$ and $V_{G2}$ for driving the normal gate drive circuit are generated by respective pre-driver circuits 86 and 88. The pre-driver circuits 86, 88 generate gate control signals $V_{G1}$ and $V_{G2}$ for the PMOS transistor M1 and the NMOS transistor M2 so that the PMOS transistor M1 and the NMOS transistor M2 are turned on and off alternately in response to the input signal $V_{IN}$. That is, the PMOS transistor M1 and the NMOS transistor M2 are not turned on at the same time. In normal circuit operation, as the input signal $V_{IN}$ switches between a logical high level and a logical low level, the normal gate drive circuit 66 generates the gate drive signal $V_{gctrl}$ to cause the IGBT to switch on and off. More specifically, the NMOS transistor M2 is turned on to drive the gate terminal of the IGBT to ground to turn off the IGBT in normal operation. Alternately, the PMOS transistor M1 is turned on to drive the gate terminal of the IGBT to power supply voltage Vdd to turn on the IGBT in normal operation.

In the present embodiment, the soft-start protection gate drive circuit 68 includes a PMOS transistor M3 connected in series with an impedance Z3 between the positive power supply Vdd (node 64) and the output node 62 of the normal gate drive circuit 66, which is also the gate terminal of the IGBT. In the present embodiment, the soft-start protection gate drive circuit 68 is a shared circuit with the over-voltage protection gate drive circuit. As described in the aforementioned copending and commonly assigned U.S. patent application Ser. No. 15/360,590, the over-voltage protection scheme uses a protection gate drive circuit includes the PMOS transistor M3 and an NMOS transistor M4 connected in series between the positive power supply Vdd (node 38) and ground. The impedance Z3 is provided at the drain terminal of the PMOS transistor M3 and an impedance Z4 is provided at the drain terminal (node 52) of the NMOS transistor M4. The common node 62 between the PMOS transistor M3 and the NMOS transistor M4 is the output signal of the protection gate drive circuit. The protection gate drive circuit 68 generates an output signal on node 62 as the gate drive signal $V_{gctrl}$ coupled to the gate terminal of the IGBT. In the present embodiment, the soft-start protection gate drive circuit 68 uses the pull-up portion (PMOS transistor M3) of the protection gate drive circuit since the soft-start protection scheme is only concerned with pull-up on the gate terminal of the IGBT, or turning on the IGBT.

Gate control signal $V_{G3}$ for driving the soft-start protection gate drive circuit 68 is generated by a soft pre-driver circuit 84.

To implement the soft-start protection scheme, the controller circuit 65 includes an input detector 67, a soft start time detector 82 and a soft start control circuit 80. The input detector 67 detects signal pulses on the system input signal $V_{IN}$. In one embodiment, the input detector 67 includes input noise filtering for both turn on transitions and turn off transitions of the system input signal $V_{IN}$. The soft start time detector 82 measures the time duration between input pulses and generates a soft-start enable signal SSH. The soft-start enable signal is asserted when the time duration between input signal pulses becomes too long. That is when there is a long idle period in the system input signal, the signal SSH will be asserted. In the present embodiment, the system input signal may pass through the soft start control circuit 80 to the pre-driver circuits 84, 86, 88. Alternately, the system input signal, or a signal indicative thereof, may be provided to the pre-driver circuits 84, 86, 88 directly.

The soft start control circuit 80 receives the soft-start enable signal SSH and also receives the Fault indicator signal FO, or a signal indicative thereof, from the protection circuit 90. The soft start control circuit 80 generates the normal drive signals ND1 and ND2 and the soft-start drive signal SD3, coupled to the respective pre-driver circuits 87, 88 and 86. When soft start is not activated, the soft start control circuit 80 asserts the normal drive signals ND1 and ND2 so that the pre-drivers 86, 88 activates the normal gate drive circuit 66 and drives the transistors M1 and M2 in response the system input signal $V_{IN}$ or the control signal $V_C$.

In response to the soft-start enable signal SSH being asserted or in response to the Fault indicator signal being asserted, the soft start control circuit 80 actives the soft-start protection scheme where the soft-start drive signal SD3 is asserted while normal drive signals ND1 and ND2 are deasserted. In this manner, transistors M1 and M2 are turned off while PMOS transistor M3 is turned on. With the impedance Z3, PMOS transistor M3 turn on the gate terminal of the IGBT softly so as to limit the peak current at the IGBT gate terminal. After the first input signal pulse, the normal drive signals ND1 and ND2 are then activated to allow the normal gate drive circuit to drive the IGBT in normal operation.

In an alternate embodiment, the soft start protection circuit is operated based on the control signal VC (FIG. 5). The control signal $V_C$ either mirrors the system input signal $V_{IN}$ or is disabled when a fault condition is detected. That is, the system input signal $V_{IN}$ is blocked from being passed to the control signal $V_C$ when the Fault indicator signal is asserted. Accordingly, in the alternate embodiment, the input detector 67 may receive the control signal $V_C$. Furthermore, the control signal $V_C$ is provided directly to the pre-driver circuits 84, 86, 88 and the soft start control circuit 80 generates the drive signals ND1 and ND2 or SD3, depending on whether soft-start gate drive is needed, to activate or deactivate the pre-driver circuits and the pre-driver circuits drive the gate drive circuit in response to the control signal $V_C$.

Figure 7:
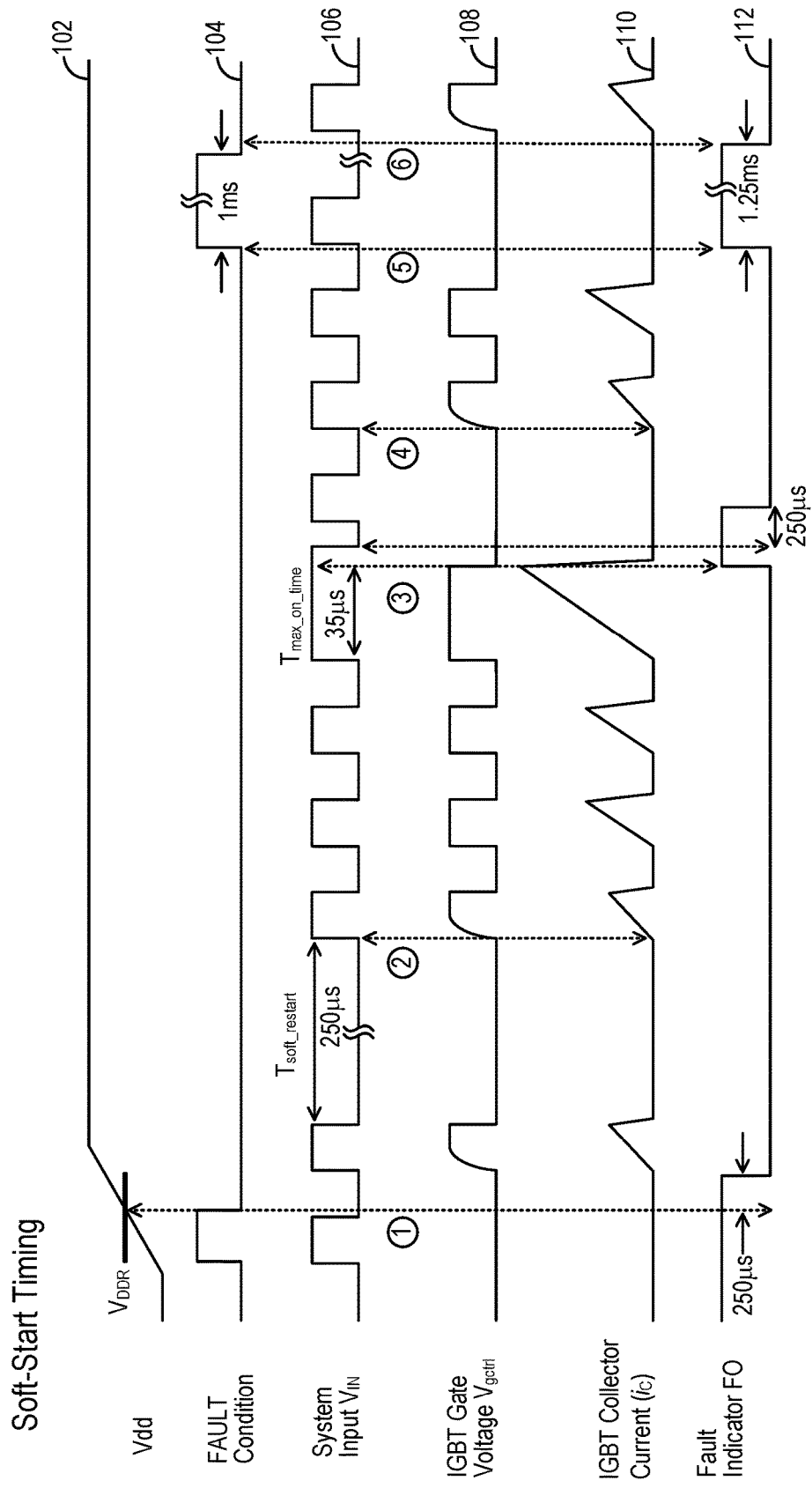
FIG. 7 is a timing diagram illustrating the operation of the controller circuit in the soft start mode in some examples.

In embodiments of the present invention, the soft-start protection scheme is activated for the following operating conditions. Soft-start gate drive is activated for the first system input signal pulse after power up. Soft-start gate drive is also activated for the first system input signal pulse after a fault condition is removed. Finally, soft-start gate drive is activated for the first system input signal pulse after an prolonged input signal idle period. The application of the soft-start mode to various operating conditions will be further described with reference to the timing diagram of FIG. 7. FIG. 7 is a timing diagram illustrating the operation of the controller circuit in the soft start mode in some examples.

First, soft-start is activated for the first system input signal pulse after a system start up, including hot plug. Referring to FIG. 7, time region "1", when the power module is being powered up, the power supply voltage Vdd (curve 102) increases from a low voltage level to the final voltage level. When the power supply voltage Vdd is below the desired minimum power supply voltage level $V_{DDR}$, the under-voltage lock out (UVLO) protection function detects that the under-voltage condition and asserts the Fault indicator signal FO (curve 112). With the Fault indicator signal FO being asserted, the controller circuit blocks the system input signal $V_{IN}$ (curve 106) That is, all system input signal pulses are ignored until the under-voltage condition is removed. In the present embodiment, after the power supply voltage Vdd reaches the minimum power supply voltage level $V_{DDR}$, the Fault indicator signal FO is held for an extended time duration, such as 250 µs, before the Fault indicator signal FO is deasserted. The extended time duration provides a guard-band to ensure the normal operation is not resumed immediately after a fault is removed. In FIG. 7, the curve 104 represents the fault condition, that is, the start and end of the fault condition. The Fault indicator signal FO is deasserted for the extended time duration after fault is removed.

Upon power up, when the power supply voltage reached the minimum voltage level $V_{DDR}$ and the Fault indicator signal FO is deasserted, the input detector 67 detects the first system input pulse and asserts the SSH signal. The soft-start control circuit 80 is activated to turn on the soft-start protection gate drive circuit 68 to cause the IGBT gate voltage to rise up softly. Thus, the first system input pulse after power-up leads to a soft-start gate drive signal (curve 108), as shown in FIG. 7. The collector current (curve 110) at the IGBT rises in response to the gate drive signal being asserted.

Second, soft-start is activated for the first system input signal pulse after detecting that the system input signal has been idle or inactive for a given duration. For example, as shown in time region "2" in FIG. 7, the system input signal $V_{IN}$ has become idle for a long period, such as 250 µs or more. The idle period is sometimes referred to as a soft-restart period. The soft-start time detector 82 detects the idle period and asserts the SSH signal so that upon receiving a system input signal pulse after the idle period, the soft-start control circuit 80 is activated to turn on the soft-start protection gate drive circuit 68 to cause the IGBT gate voltage to rise up softly. Thus, the first system input pulse after the idle period Tsoft_restart leads to a soft-start gate drive signal, as shown in FIG. 7.

Third, soft-start is activated for the first system input signal pulse after a fault condition has been removed. In one embodiment, the soft-start control circuit detects the fault indicator signal FO has been deasserted and soft-start protection is activated for the first system input signal pulse after the fault condition is cleared. For example, at time region "3" in FIG. 7, the system input signal pulse has been asserted for a time period longer than the maximum allowable on time, e.g. 35 µs. In that case, the fault indicator signal FO is asserted and the power switch is turned off to protect the power switch. With the Fault indicator signal FO asserted, the system input signal pulses are ignored. After the fault condition is removed, that is, after the system input signal is disabled and the extended duration (e.g. 250 µs) has passed, the fault indicator signal FO is deasserted. The soft-start control circuit 80 detects the Fault indicator signal being deasserted so that upon receiving a system input signal pulse after the fault is removed, the soft-start control circuit 80 is activated to turn on the soft-start protection gate drive circuit 68 to cause the IGBT gate voltage to rise up softly. Thus, the first system input pulse (time "4") after the fault removal leads to a soft-start gate drive signal, as shown in FIG. 7.

Time period "5" illustrates another fault condition being detected and activating the Fault indicator signal FO. The fault condition can be any one of those detected by the protection circuit 90, including UVLO, OVLO, MDCD, OVCP, HTOD, or OT. When the fault condition is removed, the Fault indicator signal FO is held for the extended duration before being deasserted. The soft-start control circuit 80 detects the Fault indicator signal being deasserted so that upon receiving a system input signal pulse after the fault is removed, the soft-start control circuit 80 is activated to turn on the soft-start protection gate drive circuit 68 to cause the IGBT gate voltage to rise up softly. Thus, the first system input pulse (time "6") after the fault removal leads to a soft-start gate drive signal, as shown in FIG. 7.

Figure 8:
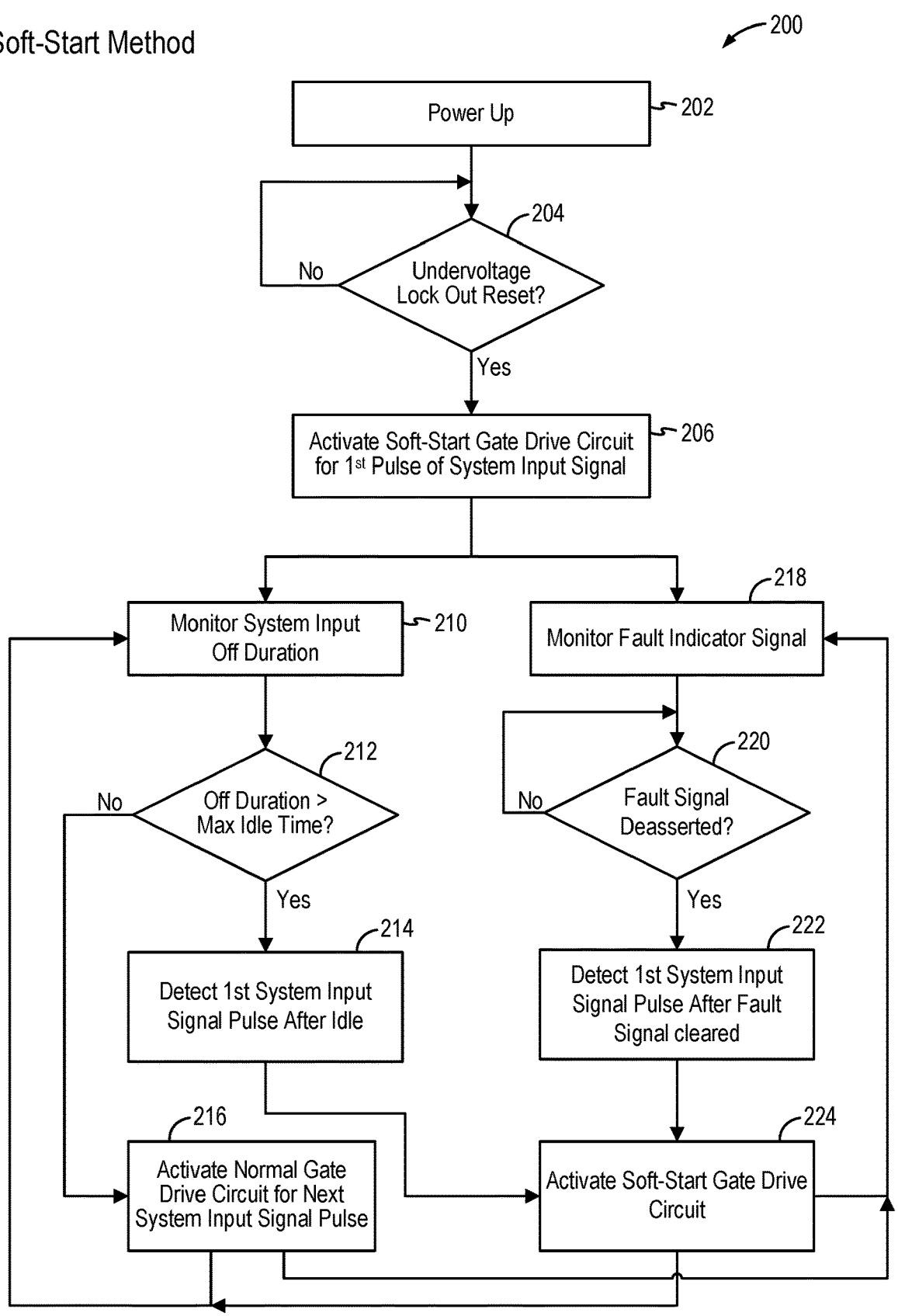
FIG. 8 is a flowchart illustrating a method for providing soft start protection for the power switching device in a quasi-resonant inverter circuit in embodiments of the present invention.

FIG. 8 is a flowchart illustrating a method for providing soft start protection for the power switching device in a quasi-resonant inverter circuit in embodiments of the present invention. Referring to FIG. 8, a soft-start protection method 200 starts when the power switching device, which may be incorporated in the intelligent power module described above, is powered up (202). The method 200 determines if the power supply voltage undervoltage lock out indicator has been reset (204). Upon power up, the undervoltage lock out indicator is set to prevent the intelligent power module from operating until the power supply voltage reaches a given voltage threshold. When the power supply voltage has reached the given voltage threshold, the undervoltage lock out indicator is reset. The method 200 activates the soft-start gate drive circuit for the first input signal pulse of the system input signal (206). As a result, a soft-start gate drive signal is generated for the first input signal pulse. The method 200 then proceeds to the two monitoring steps 210, 218 to determine when soft-start is required again during the operation of the quasi-resonant inverter circuit First, the method 200 monitors the off duration of the system input signal (210). In the event that the off duration of the system input signal has exceeded the maximum idle time (212), the method 200 detects for the first system input signal pulse after the idle period (214). The method 200 then activates the soft-start gate drive circuit (224). A soft-start gate drive signal is thus generated for the first system input signal pulse after the idle period. The method 200 returns to the two monitoring steps 210 and 218. In the event that the off duration of the system input signal is less than the maximum idle time (212), the method 200 activate the normal gate drive circuit for the next system input signal pulse (216). The method 200 returns to the two monitoring steps 210 and 218.

Meanwhile, the method 200 also monitors the Fault indicator signal (218). The Fault indicator signal FO is asserted in response to a fault condition being detected and is deasserted when the fault condition is removed. In the event that the Fault indicator signal FO is asserted, the method 200 continues to monitor the Fault indicator signal. In the event that the Fault indicator signal FO is deasserted (220), indicating that the fault condition is removed, the method 200 detects for the first system input signal pulse after the Fault signal deassertion (222). The method 200 then activates the soft-start gate drive circuit (224). A soft-start gate drive signal is thus generated for the first system input signal pulse after the fault signal is cleared. The method 200 returns to the two monitoring steps 210 and 218.

As thus provided, the soft-start protection method 200 continues to monitor the off duration or idle period of the input signal pluses and also continues to monitor the fault signal deassertion to determine when a soft-start gate drive signal is needed. The soft-start protection method 200 is operative to limit the inrush current to the power switch under certain operating conditions to improve the reliability of the power switch.

Active Turn-on Pulse Control

Turn-on duration of the IGBT in quasi-resonant converter affects the peak current and peak collector voltage of the IGBT. To ensure the safe operation and improve system reliability, the IGBT needs to be protected from extended on duration that may cause the transistor to overheat and damage the device. In embodiments of the present invention, the controller circuit implements a maximum duty cycle disable (MDCD) protection function. The MDCD protection function is operative to limit the on duration of the IGBT to not exceed a given maximum duration. In this manner, the IGBT is kept within a safe operating regime.

Furthermore, during the normal operation of quasi-resonant converter, the peak collector voltage $V_{CE}$ of the IGBT can reach 1 kV or higher with the switching frequency of 30 kHz. If the IGBT is unexpectedly turned on again at with the collector voltage still above ground level due to noise mis-triggering, the IGBT can suffer severe hard switching which can affect efficiency and reliability of the power switch. In embodiments of the present invention, the controller circuit implements an abnormal turn on disable (ATOD) protection function. The ATOD protection function maintains a minimum turn-off duration whereby the system input signal is blocked. In this manner, input noise signal during designated off period will not cause the IGBT to turn on unintentionally. In some embodiments, the ATOD protection function enforces a minimum turn-off duration of 10 µs.

In some embodiments, the controller circuit of the intelligent power module implements an integrated MDCD and ATOD protection circuit which monitors the system input signal $V_{IN}$ and blocks the system input signal pulses under certain operating conditions to protect the power switch (IGBT). In one embodiment, the MDCD protection function controls the maximum turn on duration time to keep the system operating within the safe regime while the ATOD protection function blocks unwanted input signal pulses that violates a minimum off duration. In this manner, the controller circuit improves noise immunity, efficiency, and system reliability.

Figure 9:
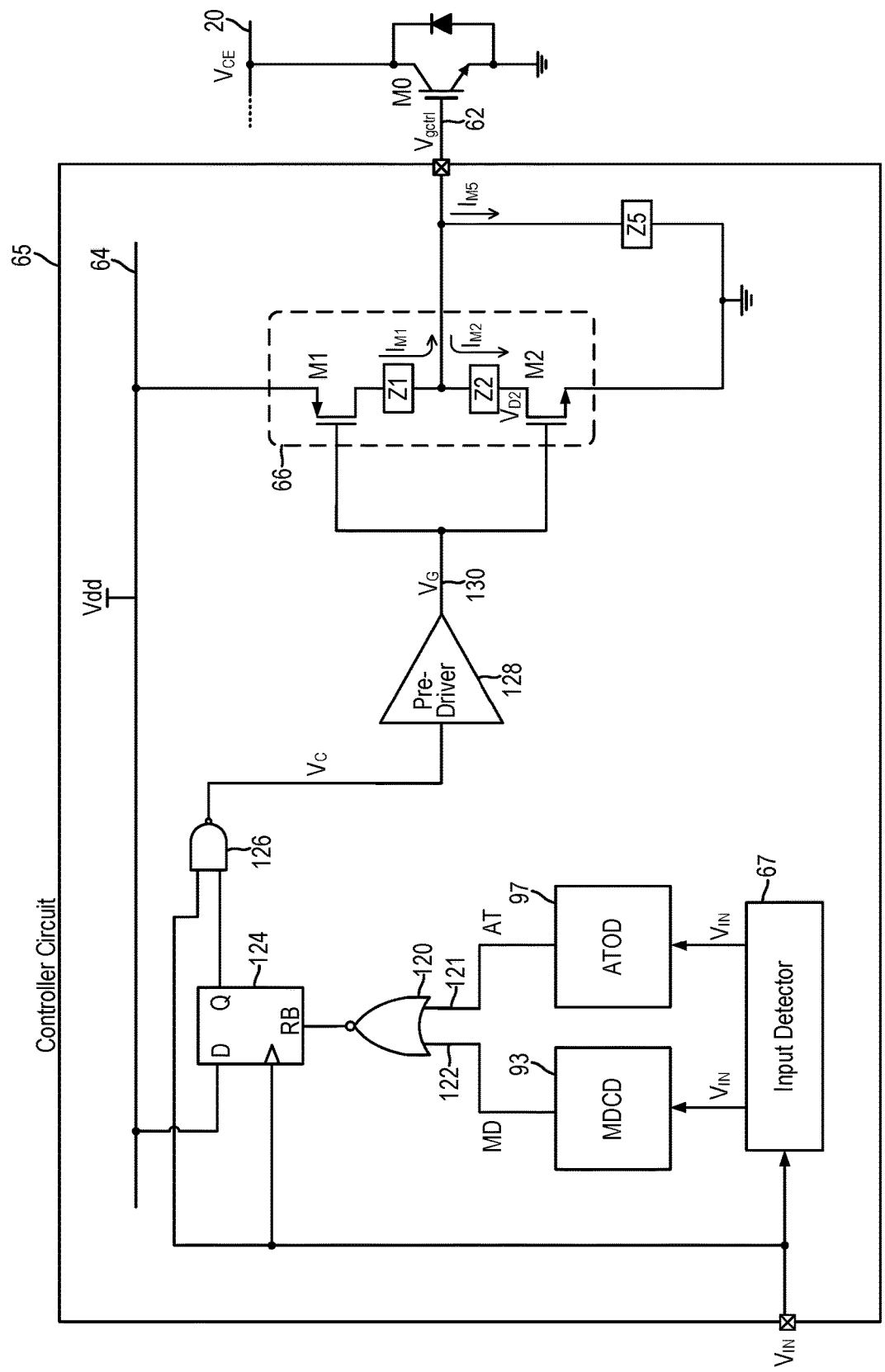
FIG. 9 is a schematic diagram illustrating the construction of the integrated MDCD and ATOD protection circuit in the controller circuit of FIG. 5 in embodiments of the present invention.

FIG. 9 is a schematic diagram illustrating the construction of the integrated MDCD and ATOD protection circuit in the controller circuit of FIG. 5 in embodiments of the present invention. Referring to FIG. 9, the controller circuit 65 includes a normal gate drive circuit 66. The normal gate drive circuit 66 is driven in response to the system input signal $V_{IN}$ to control the on and off switch cycle of the power switch M0 or the IGBT to obtain the desired power output at the quasi-resonant inverter. The system input signal $V_{IN}$ can be a PWM signal, or a clock signal switching between on period and off period. The normal gate drive circuit 66 generates an output signal on node 62 as the gate drive signal $V_{gctrl}$ coupled to the gate terminal of the IGBT. In the present embodiment, the normal gate drive circuit 66 is constructed as a CMOS inverter and includes a PMOS transistor M1 connected in series with an NMOS transistor M2 between the positive power supply Vdd (node 64) and ground. An impedance Z1 is coupled to the drain terminal of the PMOS transistor M1 and an impedance Z2 is coupled to the drain terminal of the NMOS transistor M2. The common node 62 between the PMOS transistor M1 and the NMOS transistor M2 is the output signal of the normal gate drive circuit 66.

The pre-driver circuit 128 generates the gate control signal $V_G$ (node 130) for driving the normal gate drive circuit. Meanwhile, the pre-driver circuit 128 is driven by a control signal $V_C$ which either mirrors the system input signal $V_{IN}$ or is disabled when a fault condition is detected. That is, the system input signal $V_{IN}$ is blocked from being passed to the control signal $V_C$ when the certain fault condition is detected. The pre-driver circuit 128 generate the gate control signal $V_G$ so that the PMOS transistor M1 and the NMOS transistor M2 are turned on and off alternately in response to the input signal $V_{IN}$. That is, the PMOS transistor M1 and the NMOS transistor M2 are not turned on at the same time. In normal circuit operation, as the input signal $V_{IN}$ switches between a logical high level and a logical low level, the normal gate drive circuit 66 generates the gate drive signal $V_{gctrl}$ to cause the IGBT to switch on and off. More specifically, the NMOS transistor M2 is turned on to drive the gate terminal of the IGBT to ground to turn off the IGBT in normal operation. Alternately, the PMOS transistor M1 is turned on to drive the gate terminal of the IGBT to power supply voltage Vdd to turn on the IGBT in normal operation.

The integrated MDCD and ATOD protection circuit in the controller circuit 65 includes an input detector 67, a MDCD circuit 93, an ATOD circuit 97, a logical NOR gate 120, a D-flip-flop 124 and a logical NAND gate 126. The NOR gate 120, the D-flip-flop 124 and the NAND gate 126 may be shared circuitry with other protection circuits, as shown in FIG. 5. The input detector 67 detects signal pulses on the system input signal $V_{IN}$. In one embodiment, the input detector 67 includes input noise filtering for both turn on transitions and turn off transitions of the system input signal $V_{IN}$. The received input signal pulses are provided to the MDCD circuit 93 and the ATOD circuit 97 in parallel. The MDCD circuit 93 generates an MD signal (node 122) and the ATOD circuit generates an AT signal (node 121).

At the MDCD circuit 93, the on duration of the input signal pulse is measured and monitored. When the on duration is detected to be at or exceeding a maximum on duration, such as 35-40 μs, the MDCD circuit 93 asserts the MD signal. The MD signal remains asserted until the system input signal pulse is deasserted. In this manner, the MDCD circuit 93 limits the on duration of the IGBT to the maximum on duration to protect the IGBT from damage. For example, in some cases, the micro controller generating the system input signal pulses that have an on-time that is longer than the desired maximum on duration. In that case, the MDCD circuit 93 operates to limit the on-time of the IGBT to the maximum on duration, regardless of the on-time provided by the micro controller.

At the ATOD circuit 97, the system input signal is monitored to detect for a deassertion transition. For example, the system input signal may have a high to low transition when deasserted. For each deassertion transition, the ATOD circuit 97 asserts the AT signal and the AT signal remains asserted for a given time duration corresponding to a minimum off duration of the IGBT. Accordingly, each time the IGBT is turned off by the system input signal, the ATOD circuit 97 is activated to enforce a minimum off duration for the IGBT. Regardless of the state of the system input signal, the ATOD circuit 97 blocks the system input signal pulses from passing through for the minimum off duration. The ATOD circuit enforces the minimum off duration for each deassertion transition of the system input signal. Thus, if the system input signal toggles rapidly, such as due to noise mis-triggering, the ATOD circuit will enforce the minimum off duration for each deassertion transition so that the last system input signal pulse will still be subjected to the minimum off duration.

The MD signal and the AT signal are coupled to the NOR gate 120 which drives the reset terminal of the D-flip-flop 124. The system input signal $V_{IN}$ is coupled to the clock input of a D-flip-flop 73. The system input signal $V_{IN}$ is further coupled to the logical NAND gate 126 which also receives the output signal of the D-flip-flop 124 as the other input. The output of the NAND gate is the control signal $V_C$ driving the pre-driver circuit 128. As thus configured, the input signal $V_{IN}$ is processed to generate the control signal $V_C$ which is coupled to drive the normal gate drive circuit 66 for generating the output voltage $V_{gctrl}$ (node 62) for driving the power switch. The control signal $V_C$ mirrors the system input signal $V_{IN}$ except when the MD signal or the AT signal are asserted to block the system input signal pulses from passing through. In operation, the MD signal is asserted (e.g., active high) to limit the on duration of the IGBT and the AT signal is asserted (e.g., active high) to block system input pluses during a minimum off duration of the IGBT.

Figure 10:
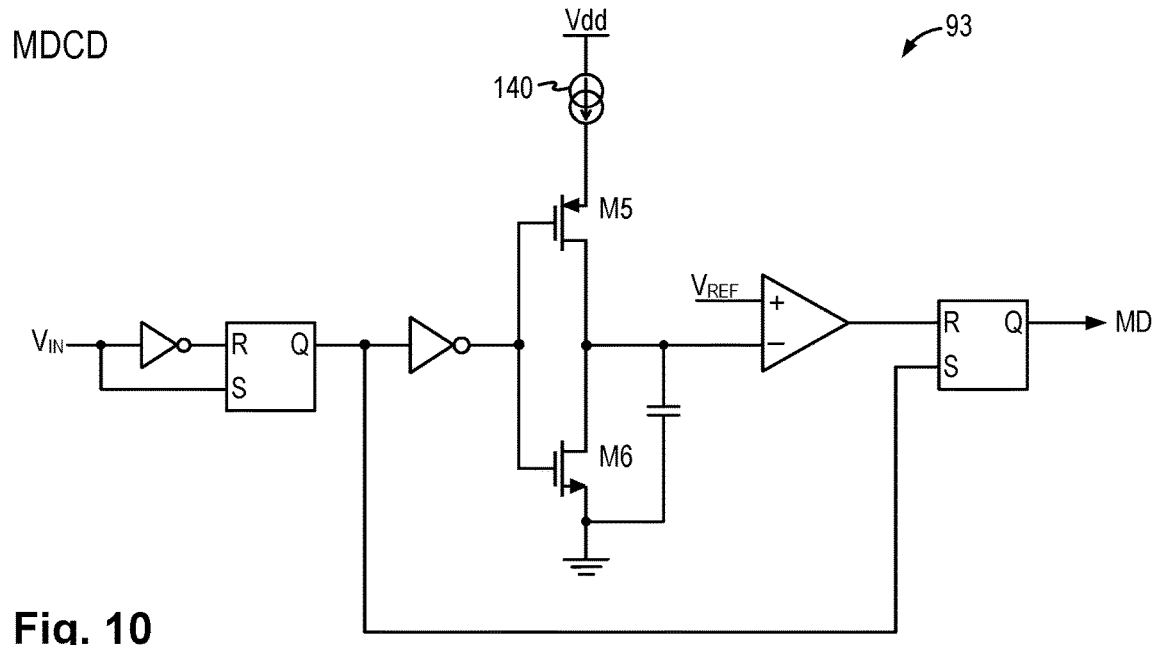
FIG. 10 is a circuit diagram of the MDCD circuit in embodiments of the present invention.

FIG. 10 is a circuit diagram of the MDCD circuit in embodiments of the present invention. Referring to FIG. 10, the MDCD circuit 93 is constructed using flip-flops, an inverter and a current source to charge a capacitor. The voltage across the capacitor is compared with a reference voltage $V_{REF}$. The reference voltage $V_{REF}$ is selected to detect the desired maximum on duration. The capacitor voltage and the reference voltage $V_{REF}$ are compared to generate the MD signal.

Figure 11:
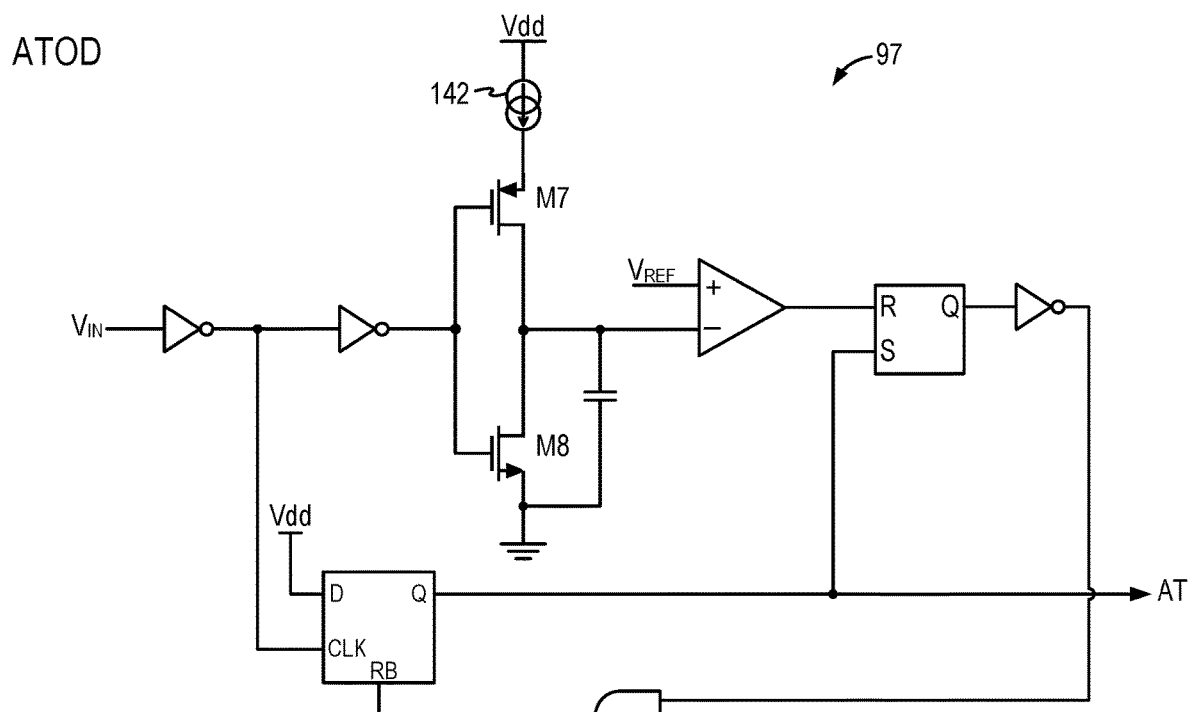
FIG. 11 is a circuit diagram of the ATOD circuit in embodiments of the present invention.

FIG. 11 is a circuit diagram of the ATOD circuit in embodiments of the present invention. Referring to FIG. 11, the ATOD circuit 97 is constructed using flip-flops, an inverter and a current source to charge a capacitor. The voltage across the capacitor is compared with a reference voltage $V_{REF}$. The reference voltage $V_{REF}$ is selected to establish the minimum off duration for the IGBT. The capacitor voltage and the reference voltage $V_{REF}$ are compared to generate the AT signal.

Figure 12:
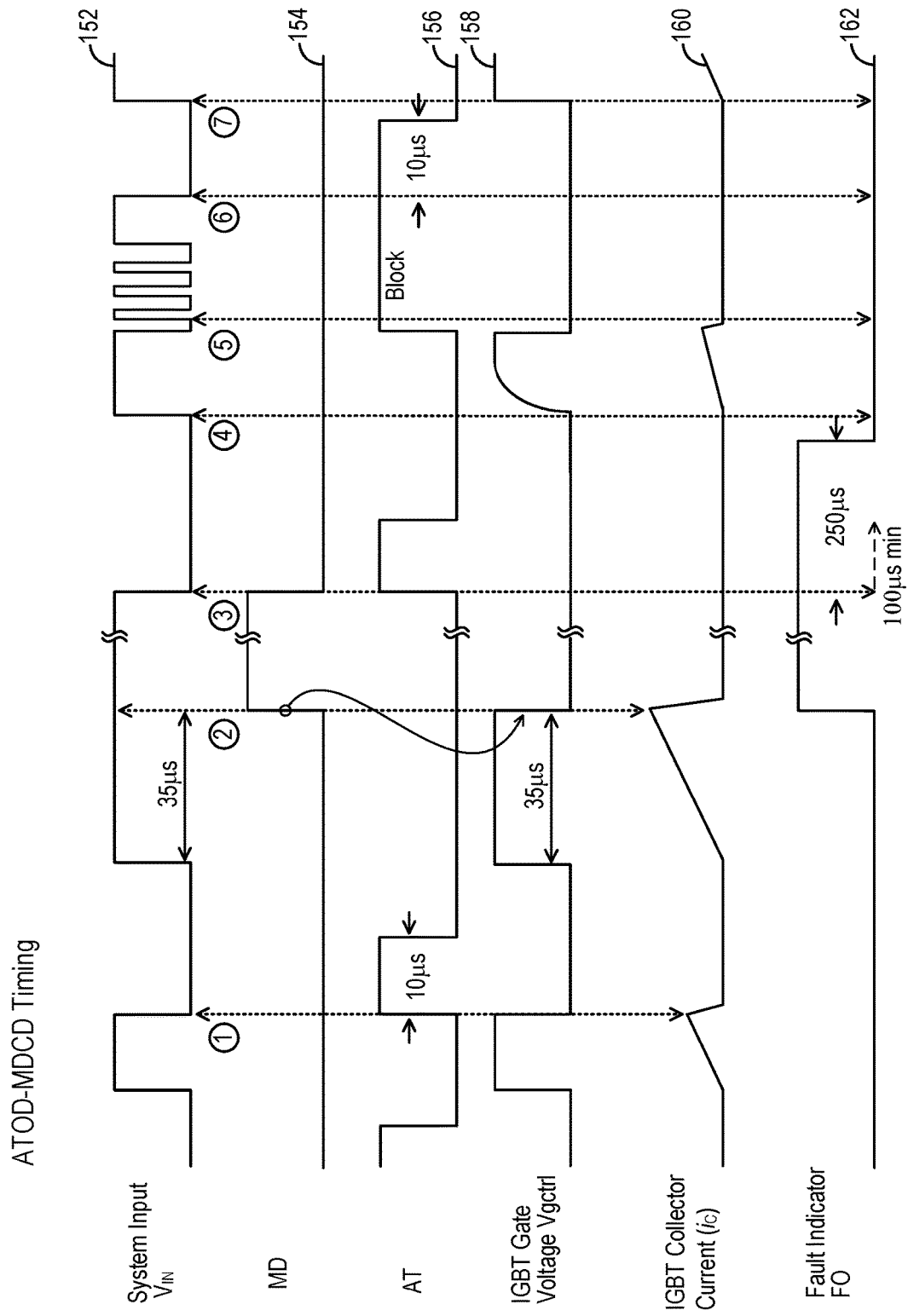
FIG. 12 is a timing diagram illustrating the operation of the controller circuit in the ATOD and MDCD mode of FIG. 9 in some examples.

FIG. 12 is a timing diagram illustrating the operation of the controller circuit in the MDCD mode and the ATOD mode of FIG. 9 in some examples. Referring to FIG. 12, as the system input signal pulses $V_{IN}$ (curve 152) arrives, the MD signal (curve 154) is deasserted (logical low) and the AT signal (curve 156) is also deasserted (logical low). For each input signal pulse, the IGBT gate voltage $V_{gctrl}$ (curve 160) is driven high to turn on the IGBT and the collect current (curve 160) flows when the IGBT is turned on.

At time "1", the system input signal transitions from being asserted (logical high) to being deasserted (logical low). In response to the $V_{IN}$ signal transition low, the AT signal is asserted for the minimum off duration, which is 10 μs in the present example. When the AT signal is asserted, any input signal pulses arriving will be blocked or ignored and the IGBT will not be turned on.

The next system input signal pulse arrives and the controller circuit operates normally until time "2" when the maximum on duration (e.g., 35 μs) for the input signal pulse is reached. In response, the MD signal is asserted and the Fault indicator signal FO is asserted in response. With the MD signal asserted, the controller circuit turns off the IGBT. When the IGBT is left turned on for a long time, the collector current can increase to a high level. In embodiments of the present invention, the IGBT is turned off by the MD signal at the maximum on duration so that the maximum collector current is capped.

The MD signal is asserted until the system input signal transition low at time "3". As a result, the MD signal is deasserted and after the extended period, the Fault indicator signal FO is also deasserted. Meanwhile, as the system input signal transition low, the AT signal is asserted to block any undesirable system input signal pulses during the minimum off time.

At time "4", the Fault indicator signal FO is deasserted and the controller circuit receives the first input signal pulse following the fault condition removal. In the present example, soft-start mode is activated for the first input signal pulse and the gate voltage is turned on softly. At the low transition of the first input signal pulse, the AT signal is asserted. At time "5", before the minimum off duration has passed, a train of input signal pulses arrive as the system input signal. The AT signal remains asserted to block the train of input signal pulses. The minimum off duration is restarted for each high-to-low transition detected so that at the last high-to-low transition at time "6", the AT signal remains asserted for the minimum off duration (10 µs). The entire time that the AT signal is asserted, the input signal $V_{IN}$ is blocked or ignored. At time "7", the minimum off duration has expired and the next system input signal pulse is then allowed to pass through to turn on the IGBT in normal operation.

Figure 13:
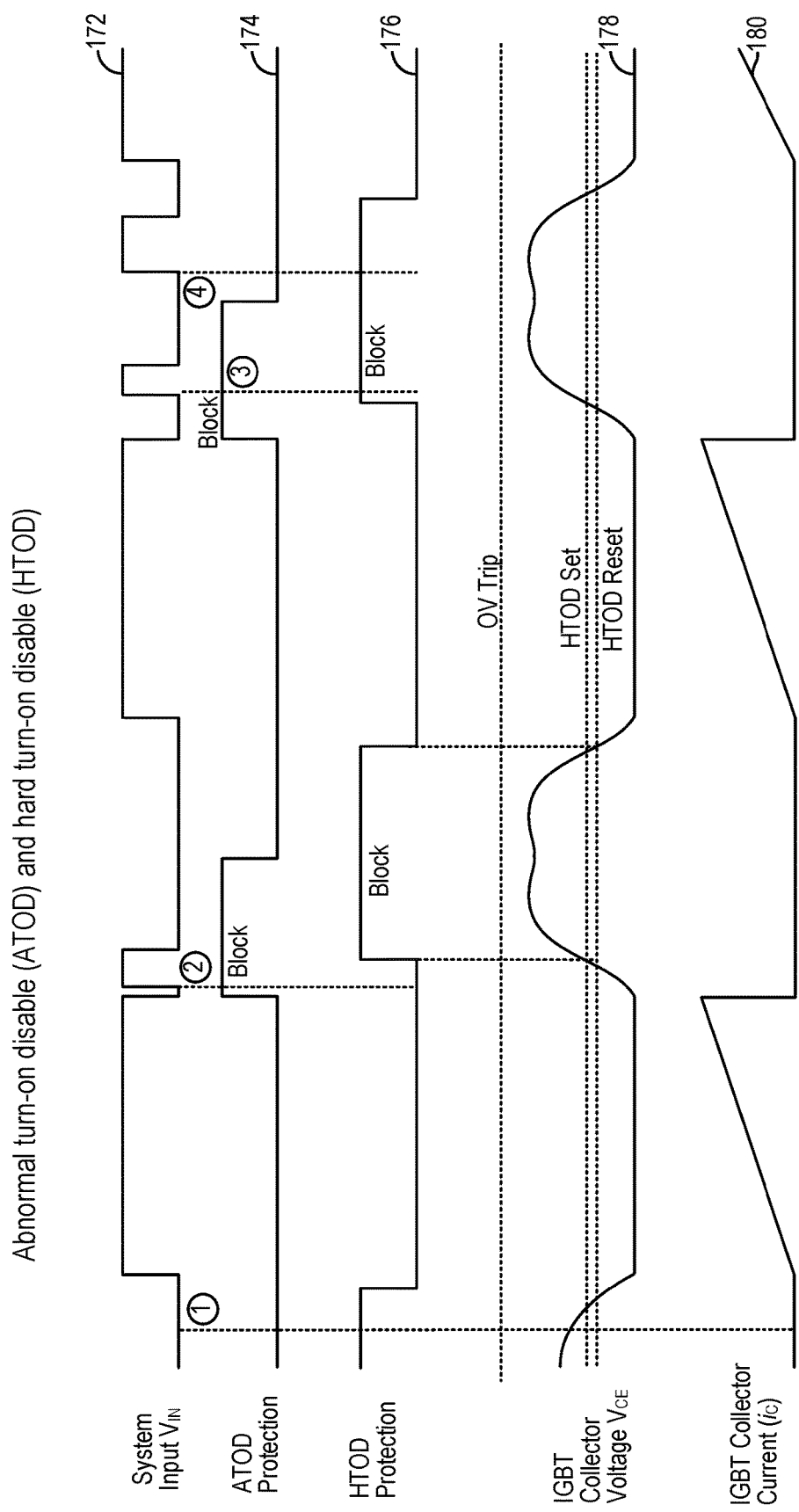
FIG. 13 is a timing diagram illustrating the operation of the controller circuit in the ATOD and HTOD protection modes in some examples.

FIG. 13 is a timing diagram illustrating the operation of the controller circuit in the ATOD and HTOD protection modes in some examples. Referring to FIG. 13, the ATOD and the HTOD protection modes both operates to block the system input signal $V_{IN}$ (curve 172). However, ATOD protection mode (curve 174) operates in response to a deassertion of the system input signal to enforce a minimum off duration. Meanwhile, the HTOD protection mode (curve 176y) operates in response to the IGBT collector voltage (curve 178) to block input signal pulses when the collector voltage is higher than the HTOD set level. At time "1", a system input signal arrives and normal operation is performed. At time "2", a second system input signal arrives within the minimum off-duration of the last input signal pulse, the ATOD protection modes blocks the second system input signal pulse. Meanwhile, the HTOD protection mode is also activated to block any input signal pulses when the collector voltage exceeds the HTOD set level. At time "3", the ATOD protection modes again blocks the system input signal pulse that arrives within the minimum off duration of the last deassertion transition. Meanwhile, at time "4", the HTOD protection mode blocks the system input signal pulse that arrives when the collector voltage is higher than the HTOD set level.

Figure 14:
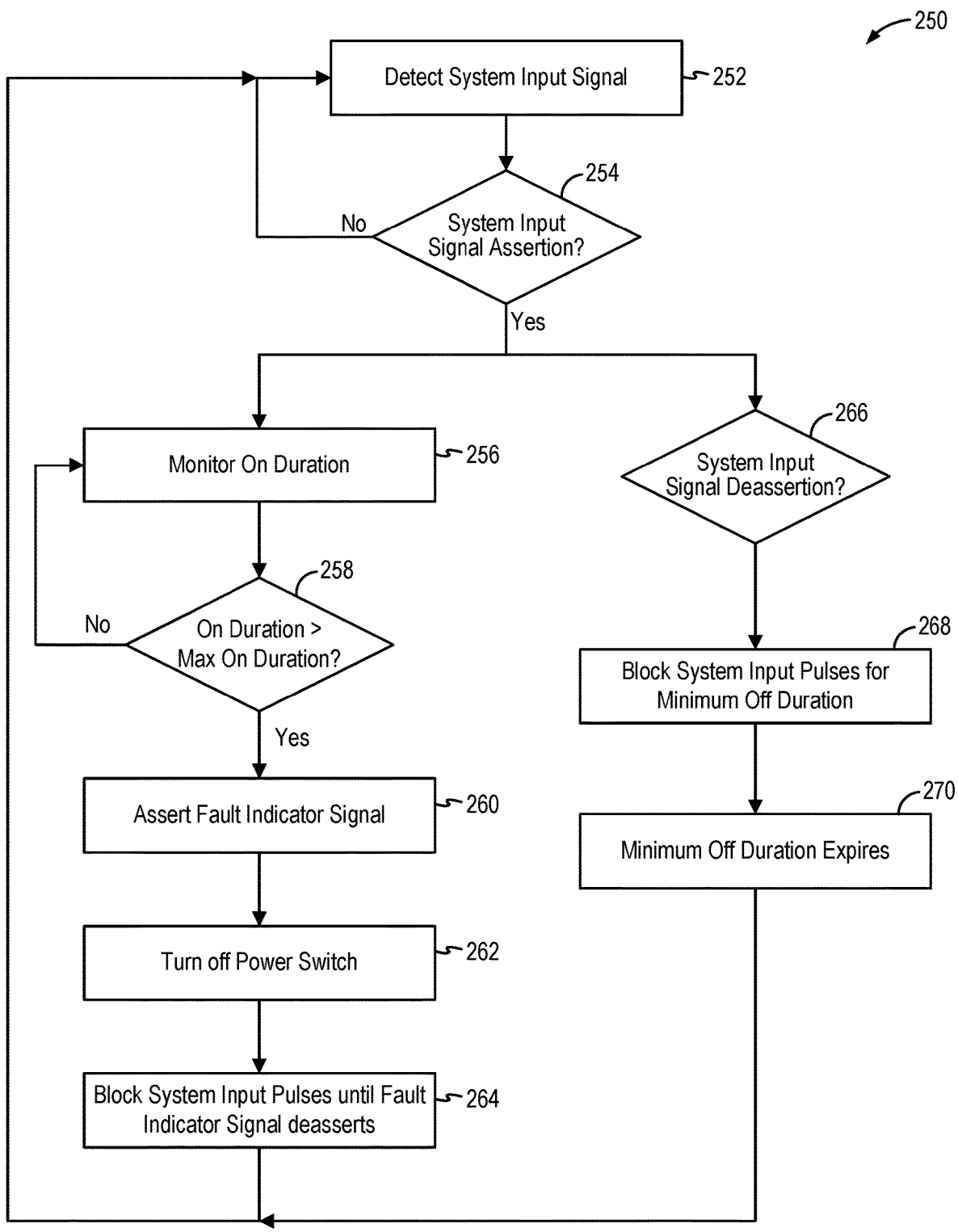
FIG. 14 is a flowchart illustrating a method for providing MDCD and ATOD protection schemes for the power switching device in a quasi-resonant inverter circuit in embodiments of the present invention.

FIG. 14 is a flowchart illustrating a method for providing MDCD and ATOD protection schemes for the power switching device in a quasi-resonant inverter circuit in embodiments of the present invention. In the present embodiment, the method 250 carries out the MDCD protection scheme and the ATOD protection scheme in parallel. In other embodiments, each protection scheme can be carried out individually without the other protection scheme. FIG. 14 is illustrative only and is not intended to be limiting.

Referring to FIG. 14, a MDCD-ATOD protection method 250 starts by detecting the system input signal pulse (252). The method 250 detects for a system input signal assertion (254). For example, the system input signal may transition from a logical low to a logical high. For the MDCD protection scheme, in response to a detection of a system input signal assertion, the method 250 monitors the on duration of the system input signal (256). The method 250 determines whether the on duration exceeds the maximum on duration (258). In response to the on duration exceeding the maximum on duration, the method 250 asserts the Fault indicator signal (260) and turns off the power switch (262). The method 250 further blocks the system input signal until the Fault indicator signal is deasserted (264). In some embodiments, the fault indicator signal is asserted for an extended duration after removal of fault condition. For example, the deassertion of the system input signal after the maximum on duration will remove the fault condition and after the extended duration (e.g. 250 µs), the Fault indicator signal is deasserted. The method 250 continues to detect for system input signal (252).

Meanwhile, for the ATOD protection scheme, the method 250 detects for a system input signal deassertion (266). For example, the system input signal may transition from a logical high to a logical low. In response to a detection of a system input signal deassertion, the method 250 blocks the system input signal pulses for the minimum off duration (268). When the minimum off duration expires (270), the method 250 continues to detect for system input signal (252).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of generating a gate drive signal for driving a control terminal of a power switch where the control terminal controls the current flow between first and second power terminals of the power switch, the method comprising:
   detecting a power up event in response to a power supply voltage increasing above a threshold voltage;
   detecting a system input signal, the system input signal determining an on-period and off-period of the power switch;
   determining a signal pulse of the system input signal being a first signal pulse following the power up event and in response to the determining, generating a soft gate drive signal to drive the control terminal of the power switch with a slowly rising voltage to softly turn on the power switch;
   generating a normal gate drive signal to drive the control terminal of the power switch in response to signal pulses of the system input signal subsequent to the first signal pulse;
   determining a signal pulse of the system input signal being a first signal pulse following an idle period of the system input signal and in response to the determining, generating the soft gate drive signal to drive the control terminal of the power switch with a slowly rising voltage to softly turn on the power switch; and
   determining a signal pulse of the system input signal being a first signal pulse following removal of a fault condition and in response to the determining, generating the soft gate drive signal to drive the control terminal of the power switch with a slowly rising voltage to softly turn on the power switch.

2. The method of claim 1, wherein the fault condition comprises one of an under-voltage of a positive power supply voltage, an over-voltage of the positive power supply voltage, an on-period exceeding a maximum on duration, and an over-temperature condition.

3. The method of claim 1, wherein determining the signal pulse of the system input signal being a first signal pulse following an idle period of the system input signal comprises:
determining a signal pulse of the system input signal being a first signal pulse following an idle period having a time duration exceeding a maximum idle duration.

4. The method of claim 3, further comprising:
determining the signal pulse of the system input signal being a first signal pulse following an idle period having a time duration less than the maximum idle duration; and
generating a normal gate drive signal to drive the control terminal of the power switch in response to signal pulses of the system input signal subsequent to the idle period.

5. The method of claim 1, further comprising:
generating the normal gate drive signal to drive the control terminal of the power switch in response to signal pulses of the system input signal subsequent to the first signal pulse after the idle period.

6. The method of claim 1, further comprising:
generating the normal gate drive signal to drive the control terminal of the power switch in response to signal pulses of the system input signal subsequent to the first signal pulse after the removal of the fault condition.

7. The method of claim 1, further comprising:
monitoring a deassertion transition of the system input signal; and
blocking the system input signal from driving the control terminal of the power switch for a minimum off duration.

8. The method of claim 1, further comprising:
monitoring a duration of the on period of the system input signal; and
turning off the power switch in response to the duration of the on period exceeding a maximum on duration.

9. The method of claim 1, further comprising:
detecting an over-voltage condition across the power switch during an off-period of the power switch; and
driving the power switch with a clamped voltage to turn on the power switch to dissipate the over-voltage.

10. The method of claim 1, further comprising:
detecting an operating condition of the power switch;
generating a fault indicator signal in response to a fault condition being detected;
blocking the system input signal from driving the power switch in response to the fault indicator signal being asserted; and
in response to the fault indicator signal being deasserted, returning to detecting the system input signal.

11. The method of claim 1, wherein the fault condition comprises one of an under-voltage of the positive power supply voltage, an over-voltage of the positive power supply voltage, and an over-temperature condition.

12. A method of generating a gate drive signal for driving a control terminal of a power switch where the control terminal controls the current flow between first and second power terminals of the power switch, the method comprising:
detecting a system input signal, the system input signal determining an on-period and off-period of the power switch;
generating the gate drive signal in response to the system input signal;
determining a duration of the on period of the system input signal exceeding a maximum on duration and in response to the determining, disabling the gate drive signal to turn off the power switch; and
determining a deassertion transition of the system input signal and in response to the determining, blocking the system input signal from the gate drive signal for a minimum off duration.

13. The method of claim 12, further comprising:
asserting a fault indicator signal in response to the system input signal exceeding the maximum on duration;
in response to the fault indicator signal being asserted, disabling the gate drive signal to turn off the power switch and blocking the system input signal from the gate drive signal; and
in response to the fault indicator signal being deasserted, returning to detecting the system input signal.

14. The method of claim 12, further comprising:
in response to the expiration of the minimum off duration, returning to detect the system input signal.

15. The method of claim 12, further comprising:
detecting a signal pulse of the system input signal being a first signal pulse following a power up event, the power up event being indicative of a power supply voltage increasing above a threshold voltage;
in response to detecting the first signal pulse following the power up event, generating a soft gate drive signal to drive the control terminal of the power switch with a slowly rising voltage to softly turn on the power switch; and
generating a normal gate drive signal to drive the control terminal of the power switch in response to signal pulses of the system input signal subsequent to the first signal pulse.

16. The method of claim 15, further comprising:
detecting a signal pulse of the system input signal being a first signal pulse following an idle period of the system input signal; and
in response to detecting the first signal pulse, generating the soft gate drive signal to drive the control terminal of the power switch with a slowly rising voltage to softly turn on the power switch.

17. The method of claim 15, further comprising:
detecting a signal pulse of the system input signal being a first signal pulse following removal of a fault condition; and
in response to detecting the first signal pulse, generating the soft gate drive signal to drive the control terminal of the power switch with a slowly rising voltage to softly turn on the power switch.

18. The method of claim 17, wherein the fault condition comprises one of an under-voltage of a positive power supply voltage, an over-voltage of the positive power supply voltage, an on-period exceeding a maximum on duration, and an over-temperature condition.

19. The method of claim 12, further comprising:
detecting an over-voltage condition across the power switch during an off-period of the power switch; and
driving the power switch with a clamped voltage to turn on the power switch to dissipate the over-voltage.

20. The method of claim 12, further comprising:
detecting an operating condition of the power switch;

generating a fault indicator signal in response to a fault condition being detected;

blocking the system input signal from driving the power switch in response to the fault indicator signal being asserted; and in response to the fault indicator signal being deasserted, returning to detecting the system input signal.

* * * * *